(12) United States Patent
Shirota et al.

(10) Patent No.: US 7,268,856 B2
(45) Date of Patent: Sep. 11, 2007

(54) PATTERN WRITING APPARATUS AND BLOCK NUMBER DETERMINING METHOD

(75) Inventors: Hiroyuki Shirota, Kyoto (JP); Katsuyuki Hisaoka, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 11/442,959

(22) Filed: May 31, 2006

(65) Prior Publication Data

US 2006/0269217 A1    Nov. 30, 2006

(30) Foreign Application Priority Data

May 31, 2005    (JP)    ............................ P2005-158382

(51) Int. Cl.
*G03B 27/54*    (2006.01)
*G03B 27/32*    (2006.01)

(52) U.S. Cl. .................. 355/67; 355/71; 355/77

(58) Field of Classification Search .................. 355/53, 355/67, 71, 77; 347/239, 241, 243; 430/22, 430/30

See application file for complete search history.

(56) References Cited

U.S. PATENT DOCUMENTS

| | | |
|---|---|---|
| 5,049,901 A | 9/1991 | Gelbart |
| 5,291,329 A | 3/1994 | Wakimoto et al. |
| 6,133,986 A | 10/2000 | Johnson |
| 6,251,550 B1 | 6/2001 | Ishikawa |
| 6,473,237 B2 | 10/2002 | Mei |
| 6,493,867 B1 | 12/2002 | Mei et al. |
| 6,537,738 B1 | 3/2003 | Mei et al. |
| 2003/0214644 A1 | 11/2003 | Shirota et al. |
| 2004/0201832 A1* | 10/2004 | Shirota ........................ 355/67 |

FOREIGN PATENT DOCUMENTS

| | | |
|---|---|---|
| EP | 0 528 285 A1 | 2/1993 |
| EP | 0 556 591 A1 | 8/1993 |
| JP | 62-21220 | 1/1987 |
| JP | 6-55776 | 3/1994 |
| JP | 6-83023 | 3/1994 |
| JP | 6-100829 | 12/1994 |
| JP | 2710519 | 10/1997 |
| JP | 2717035 | 11/1997 |
| JP | 10-112579 | 4/1998 |
| JP | 2875125 | 1/1999 |
| JP | 2001-500628 | 1/2001 |
| JP | 2001-133893 | 5/2001 |
| JP | 3254248 | 11/2001 |
| JP | 2003-332221 | 11/2003 |

* cited by examiner

*Primary Examiner*—Alan Mathews
(74) *Attorney, Agent, or Firm*—McDermott Will & Emery LLP

(57) ABSTRACT

A pattern writing apparatus comprises a DMD for spatially modulating light from a light source and directing modulated light beams to a plurality of irradiation regions, respectively, which are arranged on a substrate two-dimensionally. A pattern is written by controlling the DMD while scanning the plurality of irradiation regions. The plurality of irradiation regions form a plurality of irradiation blocks arranged in a column direction, in each of which irradiation regions are arranged in a row direction. In DMD, writing signal is sequentially inputted to mirror blocks to be used out of a plurality of mirror blocks corresponding to the plurality of irradiation blocks, respectively. When writing a pattern, an operation part determines the number of mirror blocks to be used where scan speed can be maximized, in consideration of required time for input of the writing signal to the DMD and light amount applied on the substrate.

14 Claims, 19 Drawing Sheets

PATTERN WRITING APPARATUS AND BLOCK NUMBER DETERMINING METHOD

BACKGROUND OF THE INVENTION

1. Field of the Invention

The present invention relates to a pattern writing apparatus with a spatial light modulator and a block number determining method for determining the number of modulation blocks of a spatial light modulator used for actual pattern writing in a pattern writing apparatus.

2. Description of the Background Art

Conventionally, a technique for writing a pattern on a photosensitive material by using a spatial light modulator has been suggested. As such a technique, for example, Japanese Patent Application Laid Open Gazette No. 2003-332221 (Document 1) discloses a technique where an irradiation region group onto which a DMD (Digital Micromirror Device) is projected is scanned over a photosensitive material in a scanning direction which is tilted relative to a direction of arrangement of the irradiation region group, whereby writing a pattern on a writing cell group which is set on the photosensitive material at higher density than the irradiation region group. Document 1 also discloses a method of writing at double-speed by controlling ON/OFF of light irradiation of each irradiation region every time the irradiation region group moves a distance equal to two writing cell, and a method for speeding up pattern writing with reduction of time required for input of writing data to the DMD, where a plurality of mirror blocks are arranged in a column direction, each mirror block is composed of a plurality of micromirrors arranged along a row direction, and only a few mirror blocks are used for pattern writing.

When light from a light source such as a discharge lamp or the like is directed on a photosensitive material through an optical system, if it is intended to increase an amount of applied light per unit area on the photosensitive material by reducing the size of a region where the light is emitted, an ideal light amount cannot be obtained due to the technical limitation of convergence of light in the optical system in some cases. Thus, if only a few blocks are used in writing a pattern on the photosensitive material with low sensitivity (i.e., light amount required for exposure is large) in the method of Document 1, a scan speed of the irradiation region group on the photosensitive material has to be set low from the viewpoint of application of necessary light amount on the photosensitive material, and this causes limitation in the speeding up of pattern writing.

SUMMARY OF THE INVENTION

The present invention is intended for a pattern writing apparatus for writing a pattern by applying light on a photosensitive material. It is an object of the present invention to write a pattern on a photosensitive material stably at high speed.

The pattern writing apparatus comprises a light source part; a spatial light modulator for spatially modulating light emitted from the light source part and directing modulated light beams to a plurality of irradiation regions, respectively, which are arranged in a row direction and a column direction being perpendicular to each other on a photosensitive material, the plurality of irradiation regions forming a plurality of irradiation blocks arranged in the column direction, in each of which irradiation regions are arranged in at least one row, writing signal being sequentially inputted to at least one modulation block on the spatial light modulator out of a plurality of modulation blocks which correspond to the plurality of irradiation blocks, respectively, ON/OFF control of light irradiation of irradiation regions included in at least one irradiation block corresponding to at least one modulation block being simultaneously carried out; a scanning mechanism for scanning the plurality of irradiation blocks over a photosensitive material in a predetermined scanning direction, writing regions being fixedly arranged two-dimensionally on the photosensitive material at a predetermined writing pitch in the scanning direction, over each of the writing regions relatively passing at least any one irradiation region included in each irradiation block; a writing controller for inputting the writing signal to the spatial light modulator in synchronization with scanning of the plurality of irradiation blocks; and a block number determining part for determining the number of modulation blocks used for pattern writing as operating block number where a scan speed can be maximized.

According to the present invention, it is possible to write a pattern on the photosensitive material stably at high speed.

According to a preferred embodiment of the present invention, the block number determining part obtains a first upper limit value of a scan speed on the basis of the writing pitch and required time function for inputting the writing signal where the number of modulation blocks to be used is a parameter, and a second upper limit value of a scan speed on the basis of the maximum light amount function of light applied on a photosensitive material where the number of the modulation blocks to be used is a parameter, a substantial width in a direction perpendicular to the scanning direction of irradiation blocks corresponding to the modulation blocks to be used, and sensitivity of the photosensitive material, and the block number determining part determines the number of the modulation blocks to be used where smaller one of the first upper limit value and the second upper limit value is maximum as the operating block number. This allows to determine the number of modulation blocks used for actual pattern writing appropriately by computation.

More preferably, the pattern writing apparatus further comprises a light amount sensor for detecting an amount of light applied on a photosensitive material from the light source part through the spatial light modulator, and in the apparatus, the block number determining part obtains the maximum light amount on the basis of the amount of light. It is thereby possible to write a pattern on the photosensitive material accurately.

According to another preferred embodiment of the present invention, the pattern writing apparatus further comprises a memory for storing a reference table representing a relationship between the number of modulation blocks where a scan speed can be maximized and sensitivity of a photosensitive material, and in the apparatus, the block number determining part determines the operating block number by referring to the reference table and sensitivity of a photosensitive material to be written. This makes it possible to determine the number of modulation blocks used for actual pattern writing easily.

Preferably, the spatial light modulator comprises two-dimensional array of a plurality of micromirrors, positions of which are individually changed. The scanning direction is titled relative to the column direction, and a distance with respect to a direction perpendicular to the scanning direction between a center of one irradiation region and a center of another irradiation region belonging to a column including the one irradiation region is equal to a pitch of the writing regions in the direction perpendicular to the scanning direction. It is thereby possible to write a high-definition pattern on the photosensitive material.

The present invention is also intended for a block number determining method for determining operating block number of modulation blocks used for actual pattern writing in a pattern writing apparatus for writing a pattern on a photosensitive material, and the pattern writing apparatus comprises a spatial light modulator for spatially modulating light emitted from a light source part and directing modulated light beams to a plurality of irradiation regions, respectively, which are arranged in a row direction and a column direction being perpendicular to each other on a photosensitive material, the plurality of irradiation regions forming a plurality of irradiation blocks arranged in the column direction, in each of which irradiation regions are arranged in at least one row, writing signal being sequentially inputted to at least one modulation block on the spatial light modulator out of a plurality of modulation blocks which correspond to the plurality of irradiation blocks, respectively, ON/OFF control of light irradiation of irradiation regions included in at least one irradiation block corresponding to at least one modulation block being simultaneously carried out, and a scanning mechanism for scanning the plurality of irradiation blocks over a photosensitive material in a predetermined scanning direction, writing regions being fixedly arranged two-dimensionally on the photosensitive material at a predetermined writing pitch in the scanning direction, over each of the writing regions relatively passing at least any one irradiation region included in each irradiation block, and in the apparatus, the writing signal is inputted to the spatial light modulator in synchronization with scanning of the plurality of irradiation blocks.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
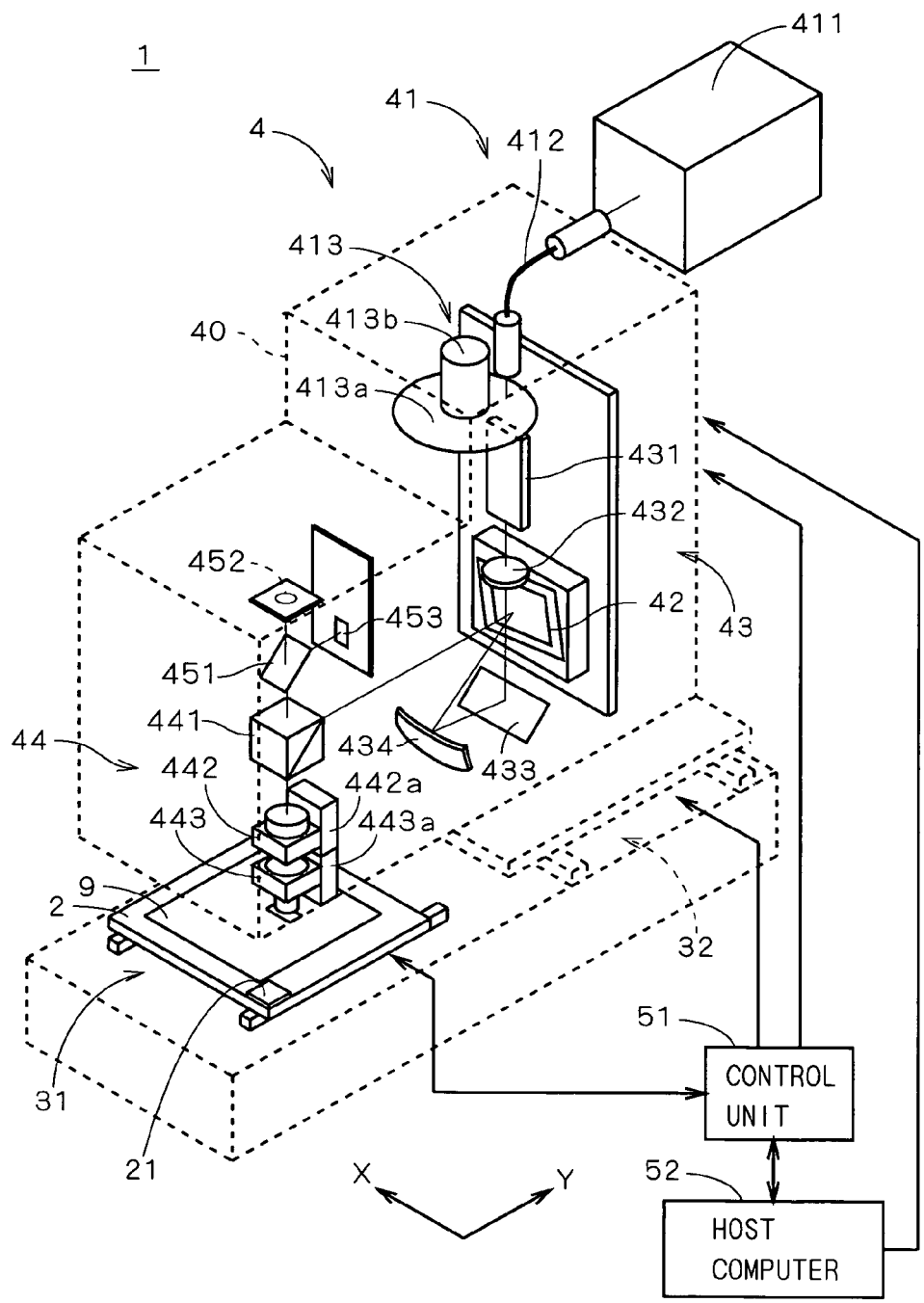
FIG. 1 is a diagram illustrating a structure of a pattern writing apparatus.

FIG. 1 is a diagram illustrating a structure of a pattern writing apparatus 1 according to a first preferred embodiment of the present invention. In FIG. 1, part of the apparatus is shown by dashed lines for illustration of the internal structure of the apparatus. The pattern writing apparatus 1 comprises a stage 2 holding a substrate 9 on which a photoresist film is formed, a stage moving mechanism 31 for moving the stage 2 in the Y direction in FIG. 1, a light irradiating part 4 for emitting light beams to the substrate 9, a light amount sensor 21 provided on the stage 2, detecting an amount of light beams emitted from the light irradiating part 4, a head moving mechanism 32 for moving a head 40 of the light irradiating part 4 in the X direction in FIG. 1, a control unit 51 connected to the light irradiating part 4, the light amount sensor 21, the stage moving mechanism 31, and the head moving mechanism 32, and a host computer 52 connected to the control unit 51, constituted of a CPU for performing various computations and a memory for storing various information.

The light irradiating part 4 comprises a lamp house 411 (in which a mercury lamp is provided, for example) functioning as a light source part connected to the head 40, and light from the lamp house 411 enters an optical fiber 412 to be directed to the head 40. The head 40 comprises a DMD 42 having a micromirror group arrayed two-dimensionally, positions (orientations) of which are individually changed, and the micromirror group reflects light beams emitted from the lamp house 411 to provide two-dimensionally spatially modulated light beams.

More specifically, the light emitted from the lamp house 411 is directed to a light control filter 413 through the optical fiber 412. The light control filter 413 comprises a disc-like filter plate 413a having different transmittances along its circumference, and a motor 413b rotates the filter plate 413a by a predetermined rotation angle, whereby an amount of light is controlled. The light transmitted through the filter plate 413a is directed to a mirror 434 through a rod integrator 431, a lens 432 and a mirror 433, and then the mirror 434 focuses and directs the light onto the DMD 42. The incoming light is uniformly applied to the micromirror group of the DMD 42 at a predetermined angle of incidence. Thus, in the light irradiating part 4, the rod integrator 431, the lens 432, the mirror 433 and the mirror 434 constitute an illumination optical system 43 for directing light from the lamp house 411 to the DMD 42.

A bundle of modulated light beams (i.e., spatially modulated light beams) generated from only reflected light from part of micromirrors of the DMD 42 which are set in a predetermined position (a position corresponding to an ON state in description of light irradiation by the DMD 42) enters a cube beamsplitter 441 and is reflected to a zoom lens 442, and the bundle of modulated light beams is controlled in magnification by the zoom lens 442, to be directed to a projector lens 443. The zoom lens 442 is controlled by an actuator 442a for zooming such that the magnification is variable. The projector lens 443 is controlled by an actuator 443a for auto-focusing (AF) such that focusing can be achieved. The light beams from the projector lens 443 are then directed toward a region on (the photoresist film of) the substrate 9 which is made optically conjugate to the micromirror group, and a light beam modulated by each of the micromirrors (and therefore causing modulation) is applied to a corresponding irradiation region. In the pattern writing apparatus 1, therefore, the cube beamsplitter 441, the zoom lens 442, and the projector lens 443 constitute a projection optical system 44 for carrying out reduction projection of the light emitted from each of the micromirrors onto a corresponding irradiation region on the substrate 9.

A half mirror 451, a laser diode (LD) 452 for AF, and a sensor 453 for AF sensing are disposed above the cube beamsplitter 441. Light emitted from the LD 452 is transmitted through the half mirror 451 and applied to the substrate 9 through the cubic beam splitter 441, the zoom lens 442 and the projector lens 443. Then, the light from the substrate 9 travels in a reverse direction and is reflected by the half mirror 451, to be sensed by the sensor 453. Output of the sensor 453 is used for control of the actuator 443a for AF.

The stage 2 is fixed on a movable side of the stage moving mechanism 31 which is a linear motor, and the control unit 51 controls the stage moving mechanism 31 so that an irradiation region group irradiated with light from the micromirror group (herein, one micromirror corresponds to one irradiation region) continuously moves relative to the substrate 9 in the Y direction in FIG. 1 over the substrate 9. That is, the irradiation region group is fixed relative to the head 40 and moves over the substrate 9 with movement of the substrate 9 by the stage moving mechanism 31 which is a scanning mechanism.

The head 40 is fixed on a movable side of the head moving mechanism 32 and intermittently moves in a sub-scanning direction (X direction) perpendicular to the main scanning direction (the Y direction in FIG. 1) of the irradiation region group. That is, every time main scan is completed, the head moving mechanism 32 moves the head 40 in the X direction to a start position for the next main scan.

Figure 2:
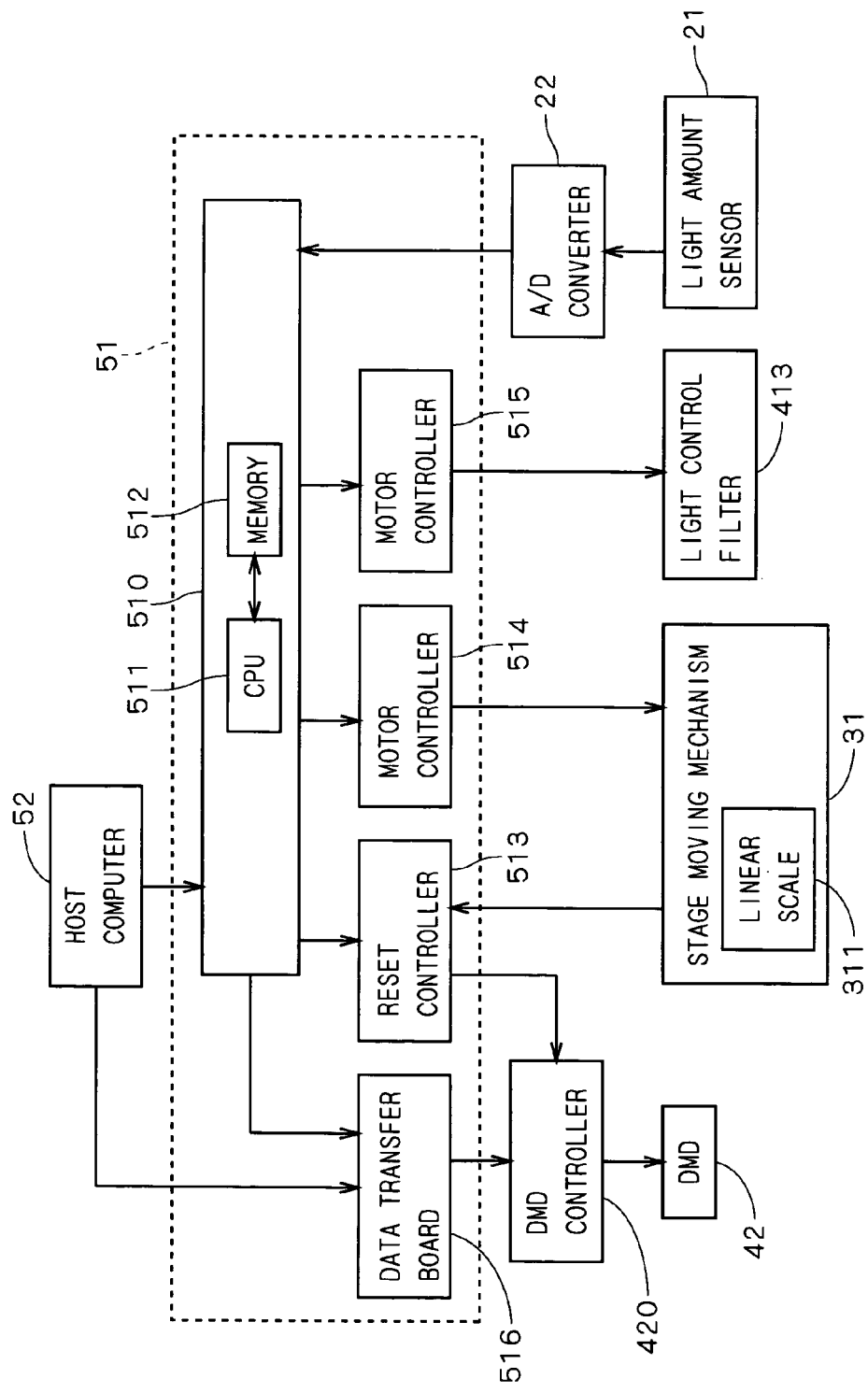
FIG. 2 is a block diagram illustrating a structure of a control unit.

FIG. 2 is a block diagram illustrating a structure of the control unit 51 together with other constituent elements. The control unit 51 comprises an operation part 510 having a CPU 511 for performing various computations and a memory 512 for storing various information, a reset controller 513 and a motor controller 514 which are connected to the stage moving mechanism 31, and a motor controller 515 connected to the light control filter 413. The motor controller 514 generates control signal to be transmitted to the stage moving mechanism 31, and the motor controller 515 generates control signal to be transmitted to the light control filter 413 under the control of the operation part 510. In the stage moving mechanism 31, a linear scale 311 for detecting a position of the stage 2 in the Y direction is provided, and a detection value (encoder signal) of the linear scale 311 is inputted to the reset controller 513. A detection value of an amount of light detected by the light amount sensor 21 is inputted to the operation part 510 through an A/D converter 22. A motor controller of the head moving mechanism 32 is actually provided to the control unit 51, but not shown in FIG. 2.

The control unit 51 further comprises a data transfer board 516 connected to the host computer 52, and the data transfer board 516 is connected to the DMD 42 through a DMD controller 420 provided in the head 40. The host computer 52 stores writing data representing a pattern which is written on the substrate 9, and writing data outputted from the host computer 52 is converted into writing signal for the DMD 42 by the data transfer board 516 and transmitted to the DMD 42. The DMD controller 420 is also connected to the reset controller 513, and pulse signal (reset pulse) from the reset controller 513 is transmitted to the DMD 42 through the DMD controller 420.

Figure 3:
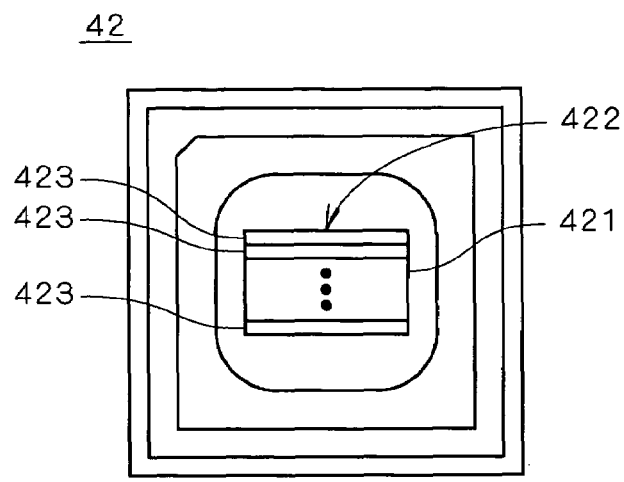
FIG. 3 is a diagram illustrating a DMD.

FIG. 3 is a diagram illustrating the DMD 42. The DMD 42 is a spatial light modulator having a micromirror group 422 in which a number of micromirrors are arrayed at equal pitches in a lattice arrangement on a silicon substrate 421 (hereinafter, they are described as an array of M rows and N columns in two directions perpendicular to each other). Each of the micromirrors is tilted at a predetermined angle (for example, at an angle of +/−12 degrees) by the action of the static electric field, according to a value of writing signal written into its corresponding memory cell. The light from the illumination optical system 43 is incident upon the DMD 42 at an angle of 24 degrees along a plane which is perpendicular to the DMD 42 and forms an angle of 45 degrees with the column direction of the DMD 42, to uniformly illuminate micromirrors of the micromirror group.

When reset pulse is applied from the reset controller 513 shown in FIG. 2 to the DMD 42 through the DMD controller 420, each of the micromirrors is simultaneously tilted in a predetermined position about a diagonal line of its reflecting surface according to data written in its corresponding memory cell. Thereby, the light beam applied to the DMD 42 is reflected in directions of the tilting of the respective micromirrors and light irradiation of the irradiation regions is ON/OFF controlled. That is, when micromirrors whose memory cells are written with data indicating the ON state receive reset pulse, light incident on those micromirrors is reflected onto the cube beamsplitter 441 and light (fine light beams) is applied to corresponding irradiation regions. On the other hand, micromirrors in the OFF reflect incident light to a predetermined position other than that of the cube beamsplitter 441, thus, no light is directed to their corresponding irradiation regions.

In the DMD 42, 14-μm-square micromirrors are arranged in a matrix in 768 rows and 1024 columns, micromirrors arranged in 48 rows and 1024 columns are used as a controllable unit (the controllable unit is indicated by reference sign 423 and hereinafter, referred to as "mirror block"), and 16 mirror blocks 423 are arranged in the column direction. Writing signal indicating ON/OFF control of light irradiation of each irradiation region is sequentially inputted to mirror blocks 423 on the DMD 42 (i.e., writing signal is inputted to the DMD 42 block by block). When writing a pattern on the substrate 9, the number of mirror blocks 423 used for pattern writing is determined in a later-discussed processing of the operation part 510 in FIG. 2 and inputted to the DMD controller 420, and only mirror block(s) 423 of determined number is used for pattern writing out of the 16 mirror blocks 423.

Figure 4:
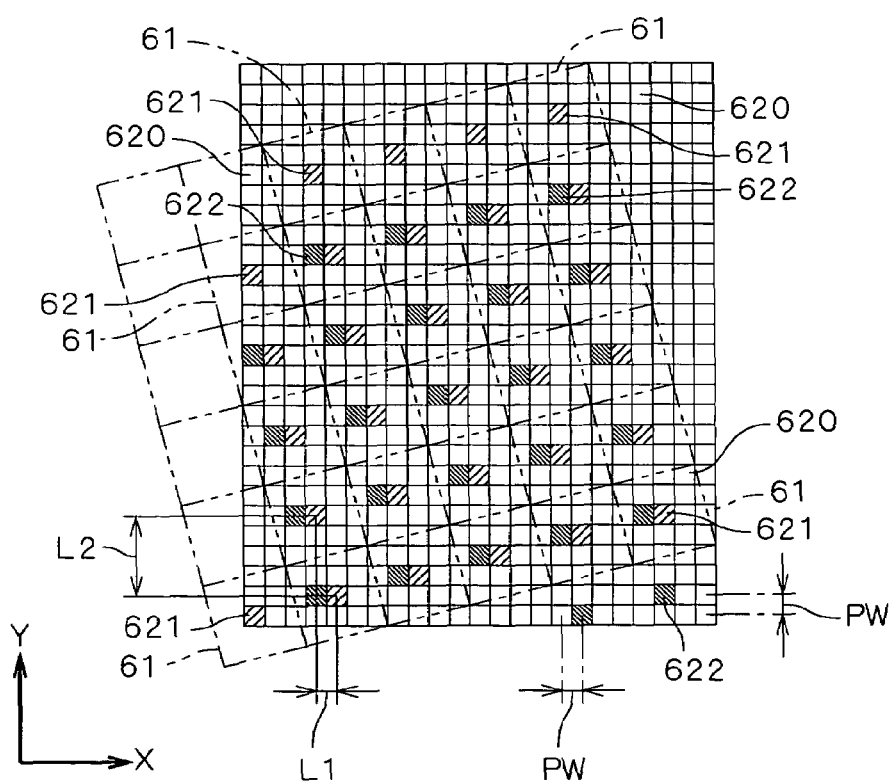
FIG. 4 is a diagram illustrating irradiation regions and writing cells.

FIG. 4 is a diagram illustrating irradiation regions 61 and writing cells 620 on the substrate 9 in the pattern writing apparatus 1. The irradiation regions 61 are regions fixed relative to the head 40, and the writing cells 620 are regions fixed on the substrate 9 and corresponding to the smallest unit of writing control (which is 2 μm square, for example). With movement of the head 40 relative to the substrate 9, the irradiation regions 61 move over the writing cells 620 relatively. The writing cells 620 are writing regions obtained by dividing the region on the substrate 9 with reference to central positions of the irradiation regions 61 (more precisely, central positions of the continuously moving irradiation regions 61) by the DMD 42. In FIG. 4, the lattice irradiation region group irradiated with light from the respective micromirrors of the DMD 42 is indicated by dash-double-dot lines and the writing cell group on the substrate 9 is indicated by solid lines. It is noted that only parts of the writing cells 620 and the irradiation regions 61 are shown in FIG. 4.

Figure 5:
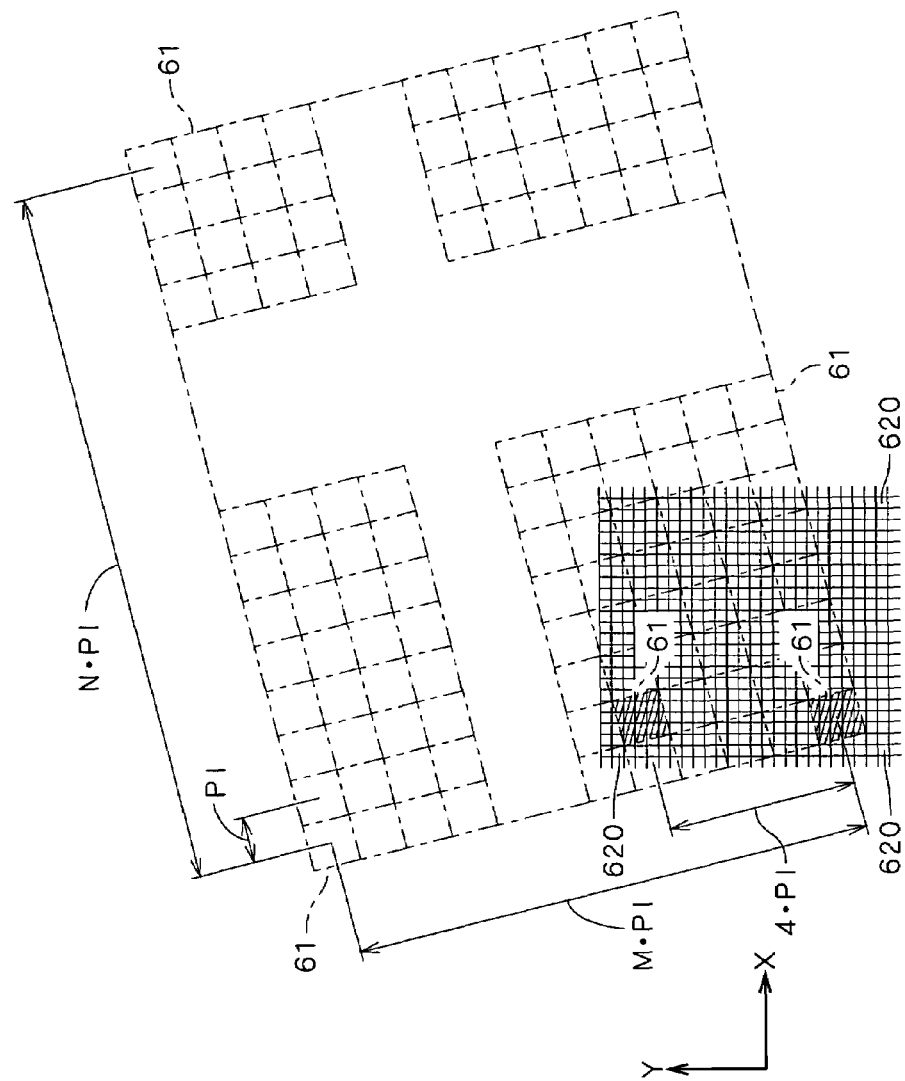
FIG. 5 is a diagram illustrating an overall irradiation region group and a writing cell group.

The writing cells 620 are rectangular writing regions fixedly arranged at the same pitch (hereinafter, referred to as "writing pitch") PW in the X direction (sub-scanning direction) and the Y direction (main scanning direction) in FIG. 4, and light irradiation centered about the central writing cells 620 (indicated by reference sign 621) of the irradiation regions 61 is performed according to corresponding writing cell data (i.e., value of writing signal written in the DMD 42). In the writing cell group, pitches in the X direction and Y direction may be different from each other. The irradiation regions 61 irradiated with reflected light from the respective micromirrors of the DMD 42 are approximately square regions which correspond in shape to the micromirrors. As shown in FIG. 5, the irradiation regions 61 are arranged in M rows and N columns at a constant pitch (hereinafter, referred to as "irradiation pitch") PI in two directions perpendicular to each other corresponding to the micromirrors of the DMD 42, and the DMD 42 is provided in a tilted (or inclined) position within the head 40 so that the directions of arrangement of the irradiation regions 61 are tilted (or inclined) relative to the main scanning direction (at an angle of 45 degrees or less).

As shown in FIG. 4, a tilt angle of the irradiation region group relative to the main scanning direction is determined so that: a center-to-center distance L1 along the sub-scanning direction (X direction) between two adjacent irradiation regions 61 arranged in a direction which extends approximately along the main scanning direction (i.e., in a direction which forms a smaller angle with the main scanning direction) out of the two directions of arrangement of the irradiation region group, is equal to the writing pitch PW of the writing cells 620 in the X direction (a center-to-center distance between adjacent writing cells 620 in the sub-scanning direction); and a center-to-center distance L2 along the main scanning direction (Y direction) between the above-noted two adjacent irradiation regions 61 is four times the writing pitch PW. In the following description, a direction approximately along the Y direction is referred to as a "column direction" of the DMD 42 and another direction approximately along the X direction is referred to as a "row direction". As indicated by hatching in FIG. 5, one of two adjacent irradiation regions 61 arranged exactly along the main scanning direction is spaced four times the irradiation pitch PI in the column direction and spaced the irradiation pitch PI in the row direction, from the other of the two adjacent irradiation regions 61.

As discussed above, in the DMD 42, since the plurality of mirror blocks 423 are arranged in the column direction of the DMD 42, a plurality of irradiation regions 61 corresponding to a plurality of micromirrors included in one mirror block 423 are arranged in the row direction in the irradiation region group on the substrate 9 to form one set (hereinafter, referred to as "irradiation block"), and a plurality of irradiation blocks are arranged in the column direction perpendicular to the row direction. Then, the number of irradiation blocks used in writing a pattern is determined, ON/OFF control of light irradiation is carried out only to the irradiation regions 61 included in the irradiation block(s) to be used, and light is not applied to other irradiation regions 61 (i.e., they are in the OFF state).

Next, the basic operation of the pattern writing apparatus 1 for writing a pattern on a photoresist film on the substrate 9 is described with reference to FIG. 6. In the following description of the operation of the pattern writing apparatus 1, the irradiation region group moves relative to the writing cell group in both the main scanning direction and the sub-scanning direction.

At the start of writing of a pattern, the CPU 511 of FIG. 2 executes a predetermined program stored in the memory 511, the operation part 510 functions as a block number determining part for determining the number of mirror blocks 423 in the DMD 42 used for pattern writing and determines operating number of mirror blocks 423 (hereinafter, referred to as "operating block number") where a scan speed of the irradiation region group can be maximized (Step S10). The operating block number is outputted to the DMD controller 420 through the data transfer board 516. A scan speed corresponding to the operating block number is outputted to the motor controller 514 and a predetermined scanning distance (control pitch in later discussion) to determine reset pulse period in the above scan speed is outputted to the reset controller 513. Details of processes for determining the operating block number will be given after description of overall operations of pattern writing.

After the operating block number is determined by the operation part 510, the mirror blocks 423 of the operating block number which are continuously disposed in the column direction (when the operating block number is 1, the number of mirror blocks 423 is also one; the same is true in the following cases) are used as the mirror blocks 423 for actual pattern writing (hereinafter, referred to as "operating blocks") in the following operations. Subsequently, writing data is sequentially outputted from the host computer 52 to the data transfer board 516, and writing signal relative to each of the micromirrors of each operating block is generated. Respective values of writing signal for corresponding writing cells to first locations of the irradiation regions 61 out of all the writing cells 620 (for example, writing cells each indicated by reference sign 621 and located at the center of the irradiation region 61 in FIG. 4) are transmitted to corresponding memory cells of the micromirrors of the DMD 42 (Step S11).

Main scanning of the irradiation region group relative to a region on the substrate 9 where a pattern is written in one main scan (hereinafter, the region is referred to as "stripe") is started (Step S12), when the reset controller 513 confirms that the irradiation region group arrives at a writing start position in the writing cell group where the writing is to be started, on the basis of signal from the linear scale 311 (Step S13), the reset controller 513 transmits reset pulse to the DMD 42, whereby each of the micromirrors included in the operating blocks where the writing signal is inputted is simultaneously tilted in a position responsive to the value of memory cell and the first exposure of writing cells 621 is performed (Step S14). At this time, micromirrors not included in the operating blocks are continuously the OFF state. More accurately, the above exposure refers to the operation for controlling ON/OFF of light irradiation of each irradiation region included in the irradiation blocks corresponding to the operating blocks, but includes a case where light is not applied, and the control relevant to exposure is referred to simply as "exposure" in the following description.

After the transmission of the reset pulse, writing signal corresponding to the next writing cells 620 (the writing cells 622 located on the (−Y) side of the writing cells 621 while being spaced four writing pitches from the writing cells 621, respectively, in FIG. 4 in the preferred embodiment) is immediately transmitted from the data transfer board 516 to memory cells of the respective micromirrors corresponding to the operating block, and values of the writing signal are written into the memory cells (Step S16). The transmission of a reset pulse to the DMD 42 by the reset controller 513 is performed in synchronization with the operation of the stage moving mechanism 31 for continuously moving the stage 2 in the main scanning direction. When the writing cell group moves a distance equal to four times the writing pitch PW (hereinafter, the distance is also referred to as "control pitch") in the main scanning direction after the application of the first reset pulse, the next reset pulse is transmitted to the DMD 42 (Steps S17, S14) and each of the micromirrors (included in the operating block) is set in a position responsive to the value of writing signal. Accordingly, an ON/OFF state of light irradiation of each of the irradiation regions as determined after the application of the first reset pulse is kept unchanged during movement of the irradiation region group by the distance equal to four times the writing pitch.

The control unit 51 inputs the writing signal and the reset pulse to the DMD 42 as a writing control part in synchronization with the scanning of the irradiation region group performed by the stage moving mechanism 31, whereby repeats the above exposure operation along with ON/OFF control of light irradiation of the irradiation region group, so that exposures centered about the writing cells 621 which have been exposed once are performed again with the eighteenth reset pulse (as counted from the first reset pulse). Immediately before the application of the eighteenth reset pulse (i.e., after application of the seventeenth reset pulse), the operation of the pattern writing is at a stage in which exposure centered about each of seventeen writing cells including the writing cell subjected to the first exposure and sixteen writing cells arranged in the (−Y) direction relative to the writing cell subjected to the first exposure has been performed only once. The above mentioned operation of the writing operation will be discussed in more detail referring to FIGS. 7 to 10.

Figure 7:
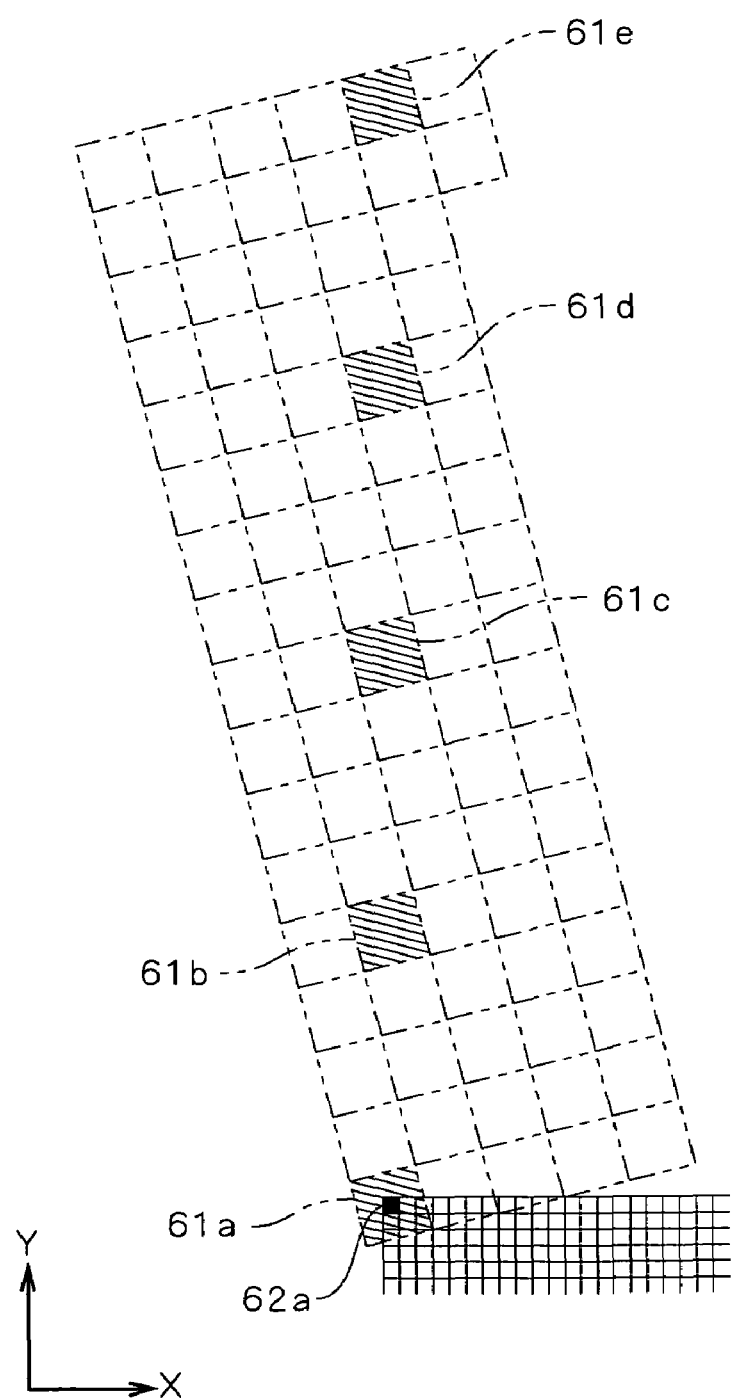
FIGS. 7 to 10 are diagrams illustrating the irradiation regions and the writing cells on which pattern writing is being performed.

FIG. 7 is a diagram illustrating the writing cell group and the irradiation region group. Upon application of the first reset pulse, exposure centered about the writing cell 620 which is solidly shaped (indicated by reference sign 62*a*) is performed. In FIG. 7, some of the irradiation regions 61 which are located exactly on the (+Y) side of the writing cell 62*a*, that is, some of the irradiation regions 61 each of which is spaced four irradiation pitches in the column direction and spaced one irradiation pitch in the row direction from its adjacent irradiation region, are hatched. Those irradiation regions are indicated by reference signs 61*a*, 61*b*, 61*c*, 61*d*, and 61*e* in order of location with respect to the (−Y) side.

In the following description, some of the writing cells which are located at respective centers of the irradiation regions 61*a*, 61*b*, 61*c*, 61*d* and 61*e* at the time of the reset pulse will be indicated by reference signs 62*a*, 62*b*, 62*c*, 62*d* and 62*e*. For easy understanding, a position of the writing cell 62*a* which is located at the center of the irradiation region 61*a* at the time of the first exposure is represented by using coordinates, as C(0, 0), and a position of the writing cell on the (−Y) side of the writing cell 62*a* is represented as C(0, 1). In an analogous manner, positions of the irradiation regions 61*a*, 61*b*, 61*c*, 61*d* and 61*e* are represented by using a coordinate system formed of axes along the row and column directions, as R( 0, 0 ), R( 1, 4 ), R( 2, 8 ), R( 3, 12 ) and R( 4, 16 ), respectively. Such representation using coordinates will be additionally provided in the following description as needed.

Figure 8:
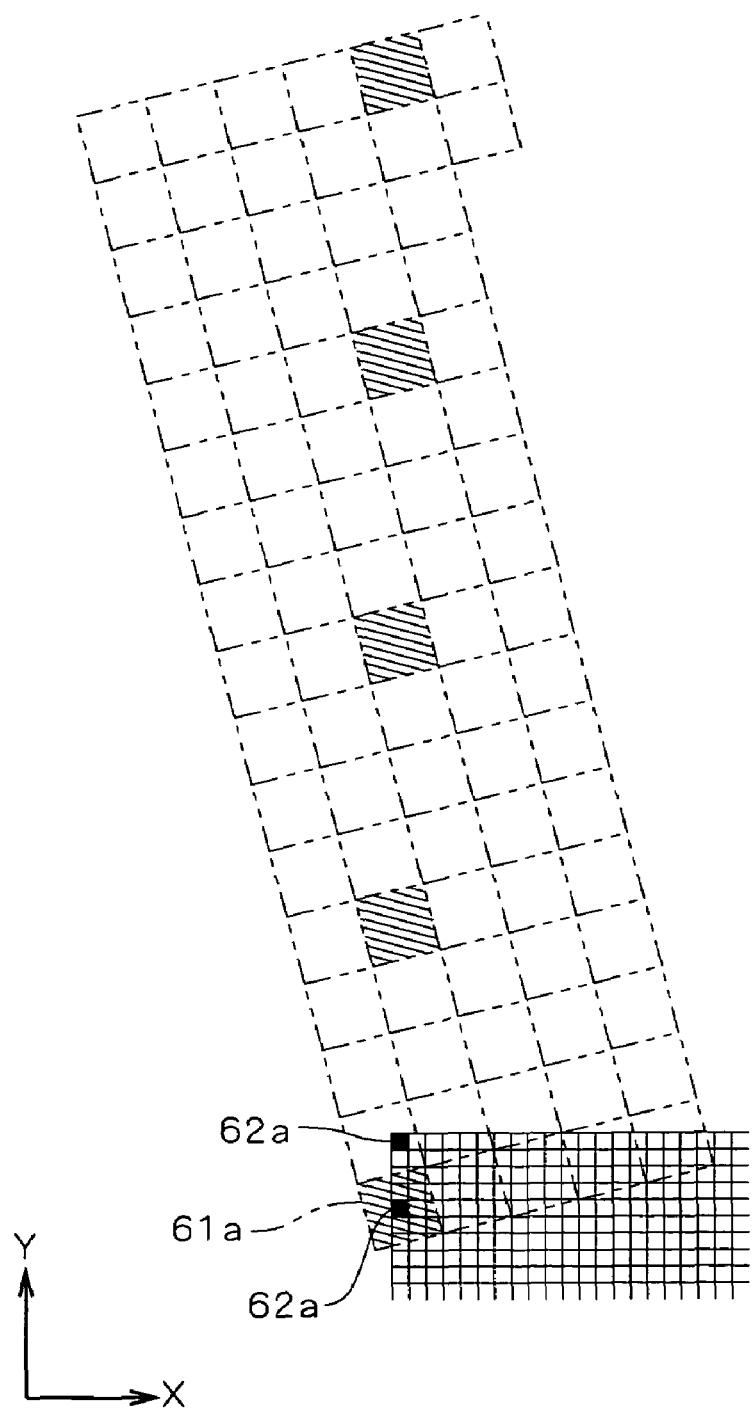
Figure 9:
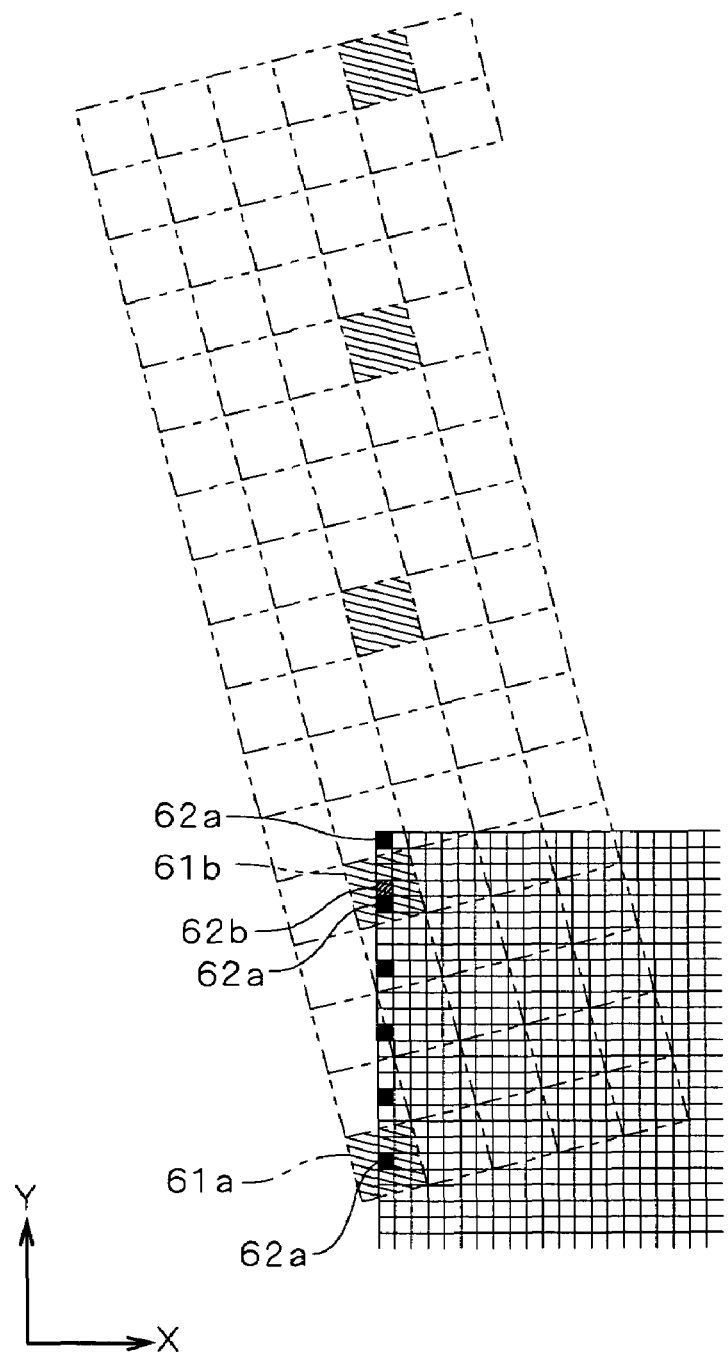

FIG. 8 is a diagram illustrating the writing cell group and the irradiation region group when the second reset pulse is transmitted to the DMD 42. The exposure state of each of the irradiation regions as determined after application of the first reset pulse (ON/OFF of light irradiation of each of the irradiation regions) is maintained until the irradiation region group moves a distance equal to four times the writing pitch (i.e., one control pitch) relative to the writing cell group. When the second reset pulse is applied, exposure centered about another writing cell 62*a* (C(0, 4)) which is spaced four times the writing pitch in the (−Y) direction from the first writing cell 62*a* (C(0, 0)) is performed. FIG. 9 illustrates a state after the sixth reset pulse is applied. Specifically, exposure of the irradiation region 61*a* centered about the writing cell 62*a* (C(0, 20)) which is located on the (−Y) side is performed, and also exposure of the irradiation region 61*b* (R(1, 4)) centered about the writing cell 62*b* (C(0, 3)) spaced three writing pitches in the (−Y) direction from the writing cell 62*a* (C(0, 0)) which is located in the (+Y) direction relative to any other writing cell is performed. Subsequently, performed is exposure centered about the writing cell spaced three writing pitches in the (−Y) direction from one of the writing cells 62*a* in the irradiation region 61*b* each time the irradiation region group moves a distance equal to four times the writing pitch.

Figure 10:
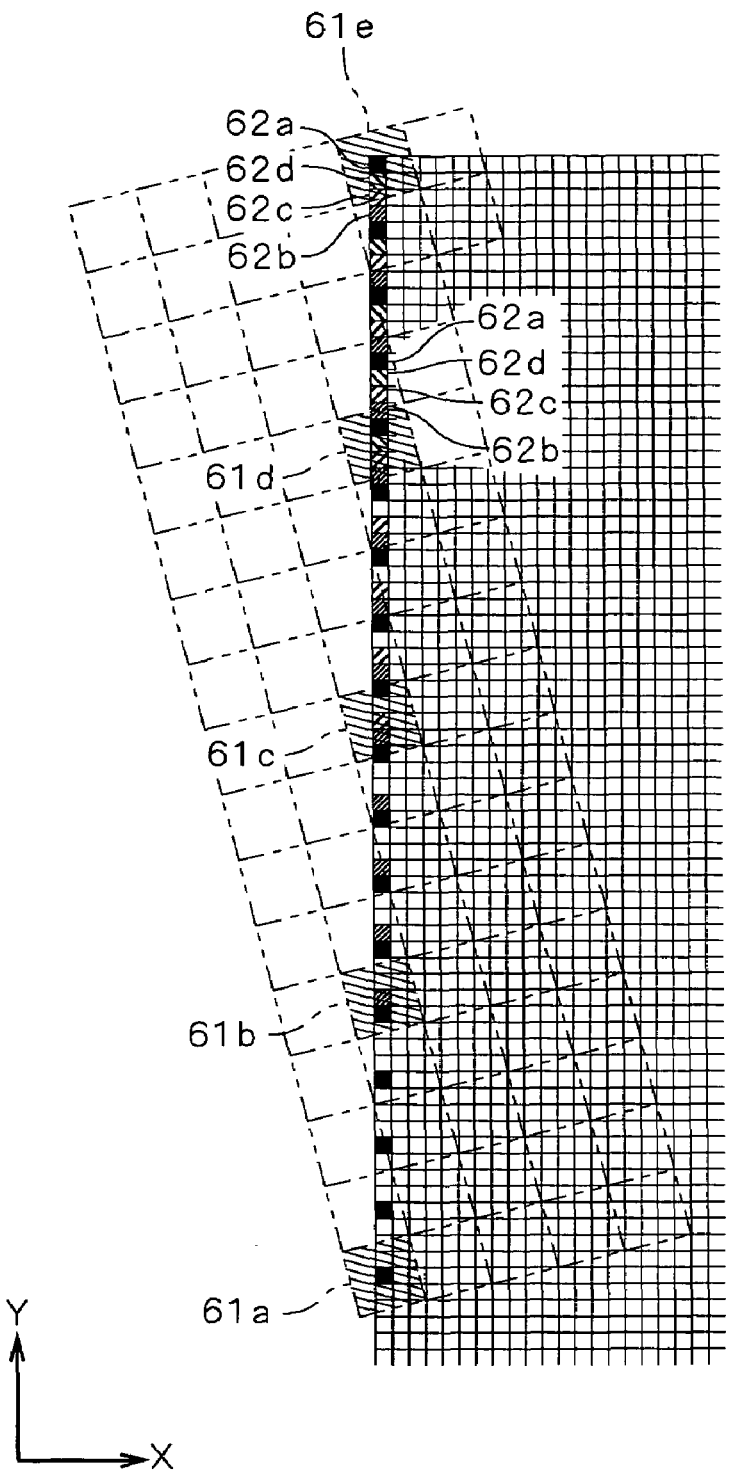

FIG. 10 is a diagram illustrating a state immediately after the eighteenth reset pulse is transmitted to the DMD 42. When the irradiation region group moves in the (−Y) direction relative to the writing cell group as illustrated in FIG. 10, exposures centered about the writing cells each located between two of the plurality of writing cells 62*a* about which the exposures have been centered in the irradiation region 61*a* located at the end in the (−Y) direction are performed in the irradiation regions 61*b*, 61*c* and 61*d*. As a result, looking at a part on the (+Y) side in the column located at the edge in the (−X) side of the writing cell group in FIG. 10, for example, the four writing cells 62*a*, 62*d*, 62*c* and 62*b* on which the exposures have been performed in the irradiation regions 61*a*, 61*d*, 61*c* and 61*b* are aligned in the (−Y) direction in the order of the occurrence in this sentence. Thus, immediately before the application of the eighteenth reset pulse, the operation of the pattern writing is at a stage in which exposure centered about each of seventeen writing cells, including the writing cell 62*a* (C(0, 0)) subjected to the first exposure and sixteen writing cells arranged in the (−Y) direction relative to the writing cell 62*a*, has been performed only once.

Exposure of the irradiation region 61*e* (R(4, 16)) centered about the writing cell 62*a* (C(0, 0)) located at the end in the (+Y) direction is performed in synchronization with the eighteenth reset pulse. Thereafter, in synchronization with subsequent reset pulses, respective exposures centered about the writing cells which have ever been subjected to exposure once are sequentially performed again in irradiation regions located in the (+Y) direction relative to the irradiation regions illustrated in FIG. 10, so that each of the writing cells is exposed twice. Further, exposure is repeated so that each of the writing cells is exposed three times and more. The cycle of repetitive exposures is seventeen reset pulses.

The above described repetitive exposures can be represented using coordinates as follows. At the time of application of the reset pulse, the writing cell 620 represented as C(0, 4k (k is an integer equal to or larger than 0)) is located at a center of the irradiation region 61 represented as R(m, 4m (m=0, 4, 8, 12 . . . 44)). The writing cell 620 represented as C(0, 4k+1) is located at a center of the irradiation region 61 represented as R(m, 4m (m=3, 7, 11, 15 . . . 47)), while the writing cells 620 represented as C(0, 4k+2) and C(0, 4k+3) are located at centers of irradiation regions 61 represented as R(m, 4m (m=2, 6, 10, 14 . . . 46)) and R(m, 4m (m=1, 5, 9, 13 . . . 45), respectively.

By repeating the above operation, in the DMD 42 comprised of M rows of micromirrors, when the operating block number is α and β rows (β is obtained from the equation ((M/16)×α) because the DMD 42 has the 16 mirror blocks 423) of micromirrors is employed, (the centers of) the plurality of irradiation regions 61 are caused to pass over relative to the writing cells 620 on the substrate 9 by the stage moving mechanism 31 so that exposure is performed (β/16) times, thereby permitting control of light amount of centered about each of the writing cells 620 with a (β/16)-step gradation.

The size of each of the irradiation regions 61 is large enough to cover a plurality of writing cells 620 as illustrated in FIG. 4, and the writing cell group moves a distance equal to four times the writing pitch (i.e., one control pitch) while a state of exposure is kept unchanged between two reset pulses. Accordingly, it is impossible to achieve light irradiation with a (β/16)-step gradation accurately. However, the minimum pattern line width to be written (i.e., pattern resolution) is usually set to be much greater than (controllable) minimum resolution of line width (i.e., line width accuracy), and the operation is controlled such that light is applied to some of the writing cells 620 which exist continuously with one another while no light is applied to other ones of the writing cells 620 which exist continuously with one another. Hence, there is no problem in practice. For example, the line width of a pattern or the width of a space between adjacent lines is about 20 μm and the (controllable) minimum resolution of the line width or the width of the space is about 2 μm.

Figure 6:
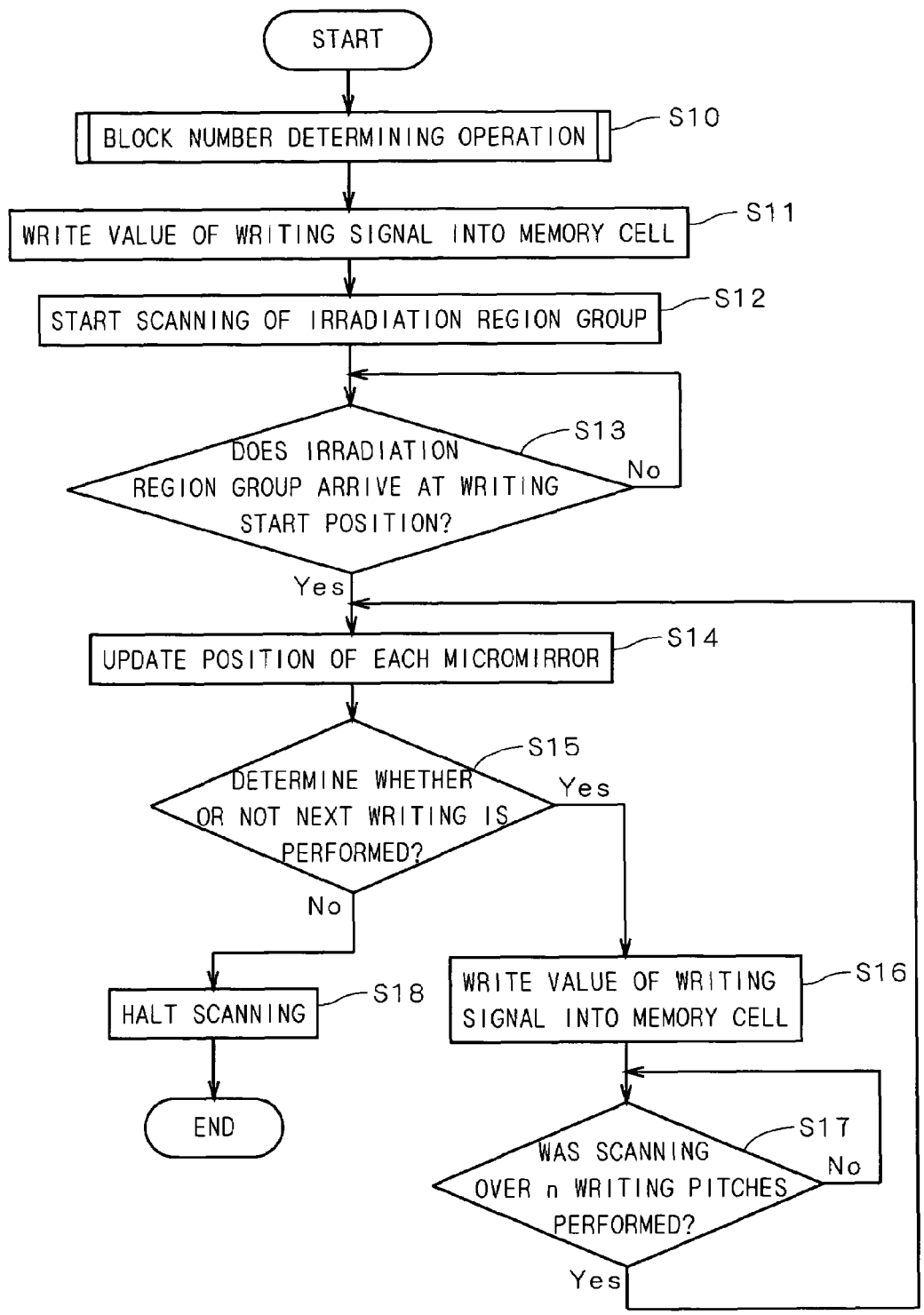
FIG. 6 is a flowchart showing a flow of pattern writing.

After the writing which should be performed in a time period during which the main scanning of the irradiation region group is performed once is finished (FIG. 6: Step S15), the main scanning is halted (Step S18). Thus, after completion of the writing of a stripe (hereinafter, referred to as "n-th stripe"), in a case where another main scanning is performed, sub-scanning of the irradiation region group in the X direction is performed by the head moving mechanism 32 and the operation is returned back to the Step S11, where the stage 2 is moved in a reverse direction ((−Y) direction) by the stage moving mechanism 31, to repeat the writing of next stripe (hereinafter, referred to as "(n+1)-th stripe").

Figure 11:
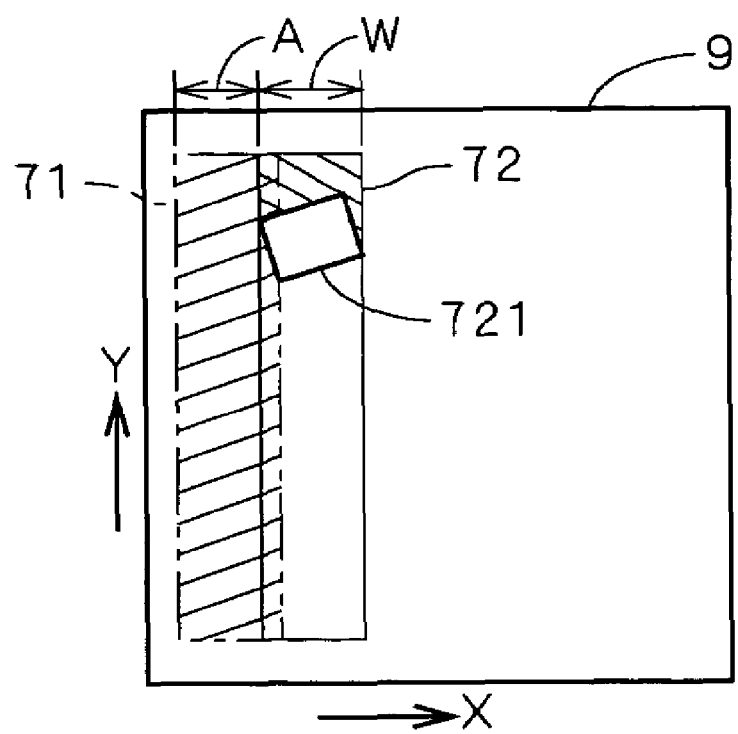
FIG. 11 is a diagram for explaining movement of the irradiation region group on a substrate.

FIG. 11 is a diagram showing that the irradiation region group after a sub scan moves in the main scanning direction for pattern writing. In FIG. 11, irradiation block group to be used out of irradiation region group (i.e., a set of the irradiation blocks corresponding to the operating blocks) is shown as a rectangular region 721, and the already-written n-th stripe is designated by reference sign 71 and the (n+1)-th stripe now being written by 72.

As shown in FIG. 11, the n-th stripe 71 and the (n+1)-th stripe 72 are spaced a distance A from each other in the sub-scanning direction (X direction), partially overlapping each other. In other words, a travel distance A of the irradiation region group in the sub-scanning direction in one intermittent movement is smaller than the width of a single stripe that is defined by the width W of the irradiation block group to be used in the sub-scanning direction.

Figure 12:
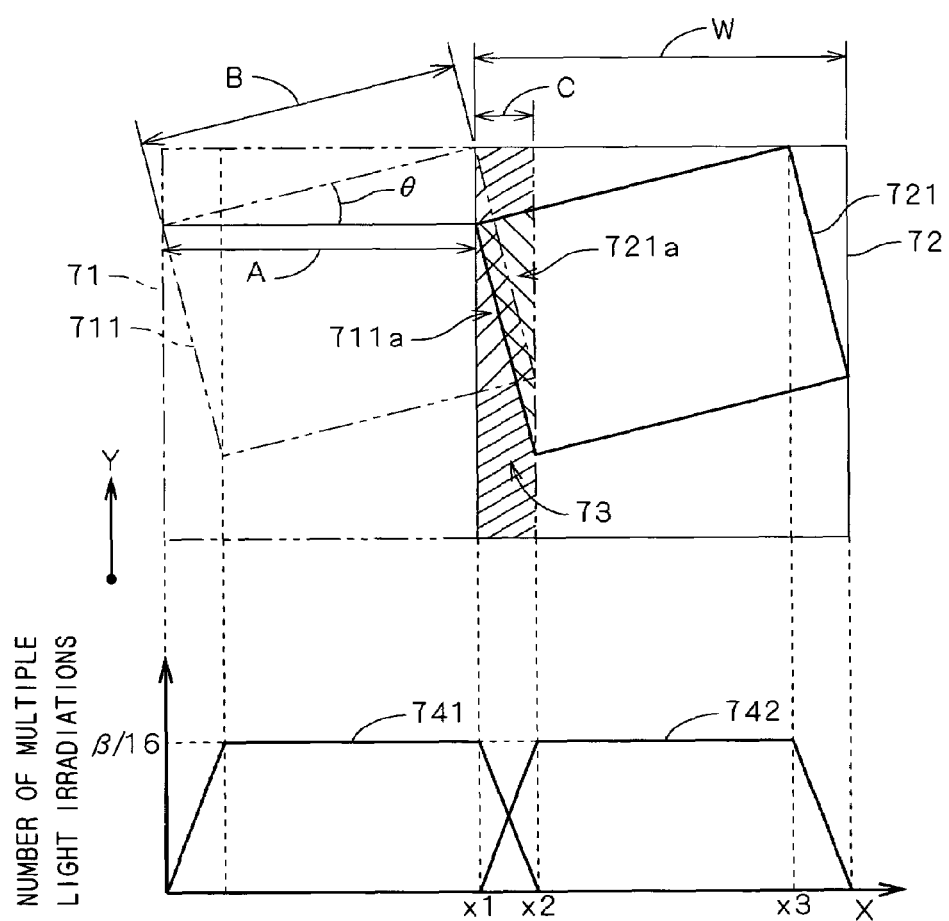
FIG. 12 is a diagram for explaining the relationship between the position of each writing cell in the sub-scanning direction in main scanning of the irradiation region group before and after a sub scan, and the number of multiple irradiations.

FIG. 12 is a diagram for explaining the relationship between the position of each writing cell 620 in the sub-scanning direction in main scanning of the irradiation region group before and after a sub scan, and the number of multiple (light) irradiations (more precisely, the number of times that the centers of the irradiation regions 61 pass over each of the writing cells 620, since actual light irradiation is not required). The upper part of FIG. 12 illustrates the irradiation block group to be used on the n-th stripe 71 and that on the (n+1)-th stripe 72 arranged side by side, shown as rectangular regions 711 and 721, respectively. The lower part of FIG. 12 shows changes in the number of multiple irradiations by the irradiation regions included in the irradiation block group to be used on the strips 71 and 72 with respect to the X direction (sub-scanning direction).

In the pattern writing apparatus 1, as illustrated in the upper part of FIG. 12, the intermittent travel distance A of the irradiation region group is made equal to a width of one side of the rectangular regions 711, 721 in the sub-scanning direction, the one side being parallel to the row direction of the rectangular regions 711, 721 (i.e., one side extending approximately along the sub-scanning direction). That is, the intermittent travel distance A of the irradiation region group is obtained from the equation (A=B×cos θ), where B is the length of one side of the rectangular regions 711, 721, the one side being parallel to the row direction, and θ is the angle formed between the row direction of the irradiation region group and the sub-scanning direction. Also, a width C over which the strips 71 and 72 overlap each other in the sub-scanning direction is expressed by the equation (C=W−B×cos θ), where W is the width of the rectangular regions 711 and 721 in the sub-scanning direction. The length B of one side of the rectangular regions 711, 721, the one side being parallel to the row direction, and the angle θ formed between the row direction of the irradiation region group and the sub-scanning direction are constant without depending on the operating block number, and thus the intermittent travel distance A is also constant.

When the equation (A=B×cos θ) is satisfied, as illustrated in the upper part of FIG. 12, a right-triangle region of the rectangular region 711 on the right side, designated by 711a, and a right-triangle region of the rectangular region 721 on the left side, designated by 721a overlap each other and both pass over a hatched region 73 (parts of the region 73 that overlap with the regions 711a and 721a are not hatched; "region 73" is hereinafter referred to as "shared writing region 73").

In a case where the irradiation block group to be used includes β rows of irradiation regions, as indicated by 741 in the lower part of FIG. 12, with the passing of the rectangular region 711, β/16 light irradiations are performed in about a central portion of the rectangular region 711; while the number of multiple irradiations in a portion between positions x1 and x2 within the range of the shared writing region 73 decreases linearly from the position x1 to x2, with the passing of the region 711a. On the other hand, as indicated by 742, with the passing of the rectangular region 721, β/16 light irradiations are performed in about a central portion of the rectangular region 721; while the number of multiple irradiations in a portion between the positions x1 and x2 decreases linearly from the position x2 to x1, with the passing of the region 721a.

By repetition of light irradiations by the regions 711a and 721a, the number of multiple irradiations on the shared writing region 73 also becomes β/16, and the entire substrate 9 can be irradiated with a (β/16)-step gradation centered about each of the writing cells 620. Therefore, it can be thought that a substantial width in the sub-scanning direction of the irradiation block group corresponding to the mirror blocks to be used is equal to the intermittent travel distance A. The substantial width in the sub-scanning direction of the irradiation block group to be used is constant without depending on the operating block number like the intermittent travel distance A.

As described above, in the pattern writing apparatus 1, the writing cell group moves a distance equal to four times the writing pitch between reset pulses, so that writing is performed at a speed which is four times as high as the speed of the writing in which the writing cell group moves a distance equal to one writing pitch between reset pulses (it is noted that the above described operation of the pattern writing is hereinafter referred to as "quad (4)-speed writing"). As a result, it is possible to perform writing at a higher speed while controlling the line width of the pattern. Furthermore, the travel distance of the irradiation region group in the sub-scanning direction in one intermittent movement is made equal to the width of one side of a rectangular region in the sub-scanning direction, the one side being parallel to the row direction of the rectangular region defined by the outer rim of the whole irradiation region group. By so doing, the number of multiple irradiations on the writing cell group on the substrate 9 with respect to the X direction becomes equal over a wide range, and the occurrence of unevenness in pattern writing on the substrate 9 can be prevented.

Figure 13:
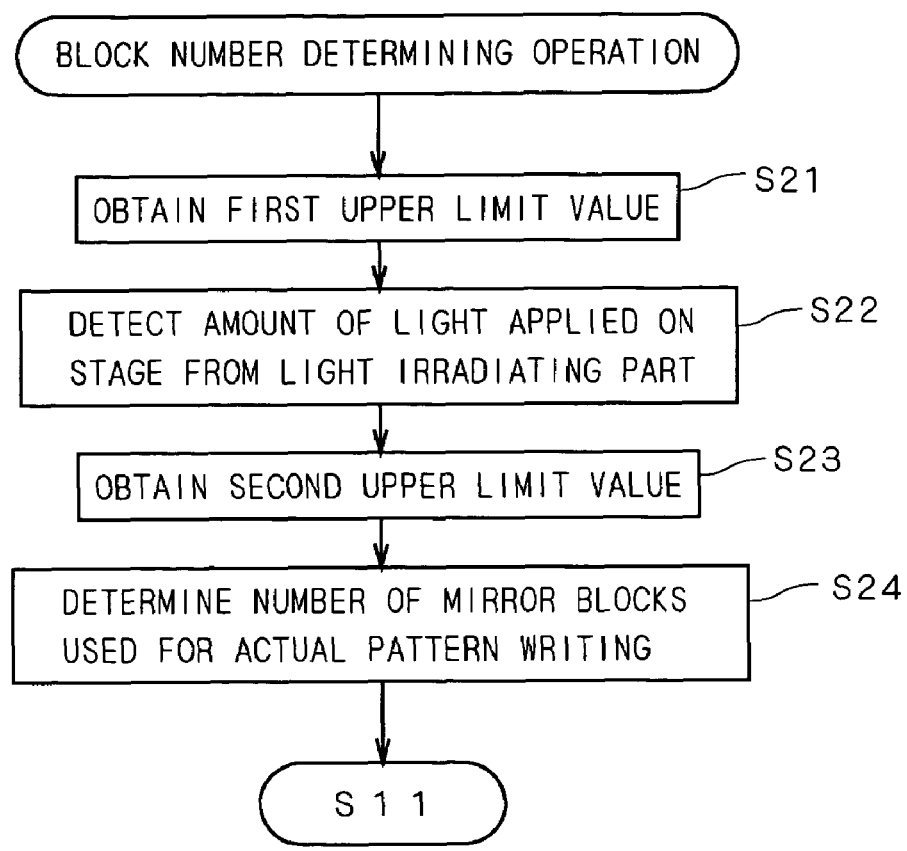
FIG. 13 is a flowchart illustrating an operation flow for determining operating block number.

Next, discussion will be made on a block number determining operation in Step S10 of FIG. 6. FIG. 13 is a flowchart illustrating an operation flow for determining the number (operating block number) of mirror blocks 423 used for actual pattern writing in the pattern writing apparatus 1.

At the determination of the operating block number, first, the upper limit value of a scan speed obtained from a minimum reset period of the DMD 42 depending on the number of mirror blocks 423 to be used and a predetermined control pitch (hereinafter, the scan speed is referred to as "first upper limit value") is obtained by processing of the operation part 510 in FIG. 2 (Step S21). Herein, discussion will be made on the minimum reset period of the DMD 42.

In the DMD 42, since a write speed of writing signal from the data transfer board 516 is 7.6 Gigabits per second (Gbit/s), required time for inputting writing signal to memory cells of all the micromirrors included in one mirror block 423 (i.e., micromirrors arranged in 48 rows and 1024 columns) is 6.5μ seconds and it is 104μ seconds when 16 mirror blocks 423 (i.e., micromirrors arranged in 768 rows and 1024 columns). After input of reset pulse in the DMD 42, the next writing signal can be inputted to each memory cell only if holding period of 18μ seconds passes, and it takes a predetermined small time to input reset pulse to the DMD 42. Therefore, a period (time period) from a time when reset pulse is inputted to the DMD 42 to a time when the next reset pulse is inputted thereto should be longer than the total time of required time for inputting of the writing signal to the DMD 42, the holding period, and required time for inputting of the reset pulse, and the total time becomes the minimum reset period. The minimum reset period of the DMD 42 depends on the number of mirror blocks 423 to be used, for example, when only one mirror block 423 is used, the minimum reset period is about 24 μ seconds and it is about 120μ seconds when 16 mirror blocks 423.

Figure 14:
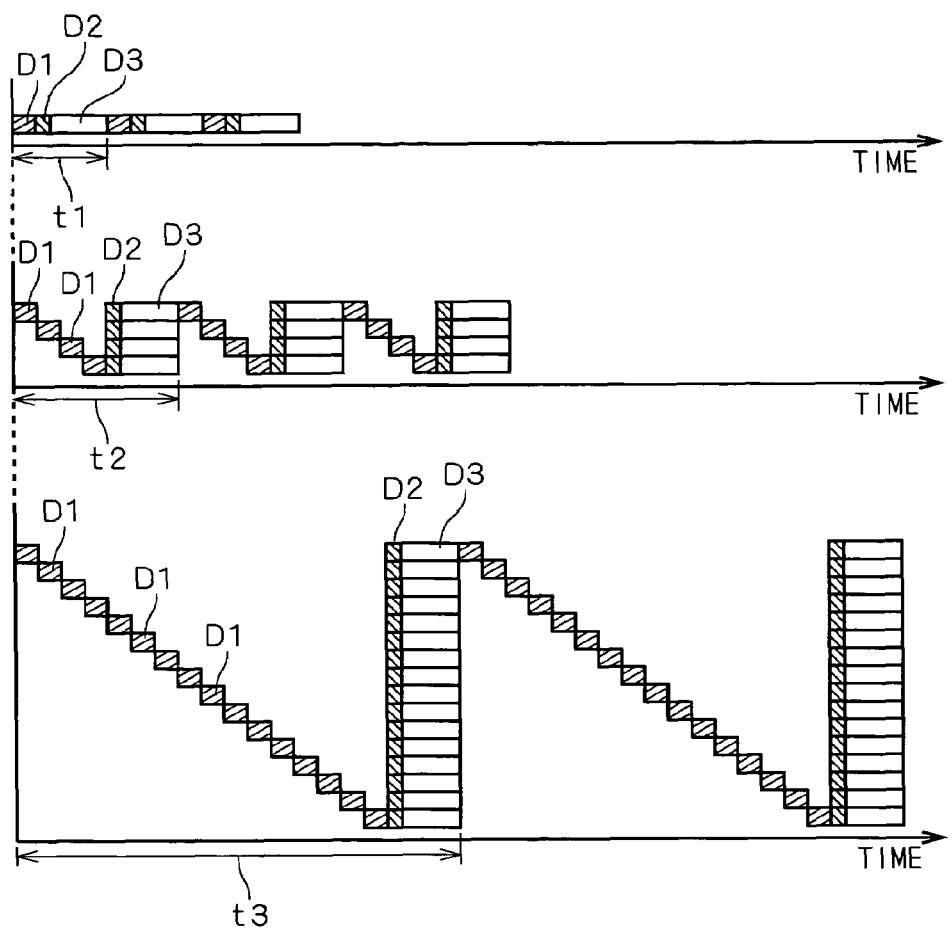
FIG. 14 is a diagram for explaining the minimum reset period of the DMD.

FIG. 14 is a diagram for explaining the minimum reset period of the DMD 42 for easy understanding. The upper part, the middle part, and the lower part of FIG. 14 illustrates required time for each operation related to the control of the DMD 42 in cases where one mirror block 423, four mirror blocks 423, and 16 mirror blocks 423 are used, respectively. In FIG. 14, required time for inputting the writing signal to memory cell of each micromirror included in one mirror block 423, required time for inputting the reset pulse, and the holding period are indicated by rectangles D1, D2, and D3, respectively. In FIG. 14, time periods indicated by arrows t1, t2, and t3 are the minimum reset period in cases where one mirror block 423, four mirror blocks 423, and 16 mirror blocks 423 are used, respectively. It is noted from FIG. 14 the minimum reset period depends on the number of mirror blocks 423 to be used.

In the operation part 510, while the number of mirror blocks 423 to be used (hereinafter, referred to as "block variable") is changed from 1 to 16, a first upper limit value Va of a scan speed relative to the block variable is calculated from the following Eq. 1 as indicated by a rhombus in FIG. 15. In Eq. 1, $t_\alpha$ is the minimum reset period in a case of a certain number of mirror blocks 423 and r is the control pitch. As described above, in the pattern writing apparatus 1, since the writing pitch is 2 μm and the quad (4)-speed writing is performed in the preferred embodiment, the control pitch is 8 μm.

$$Va = r/t_\alpha \qquad \text{Eq. 1}$$

Figure 15:
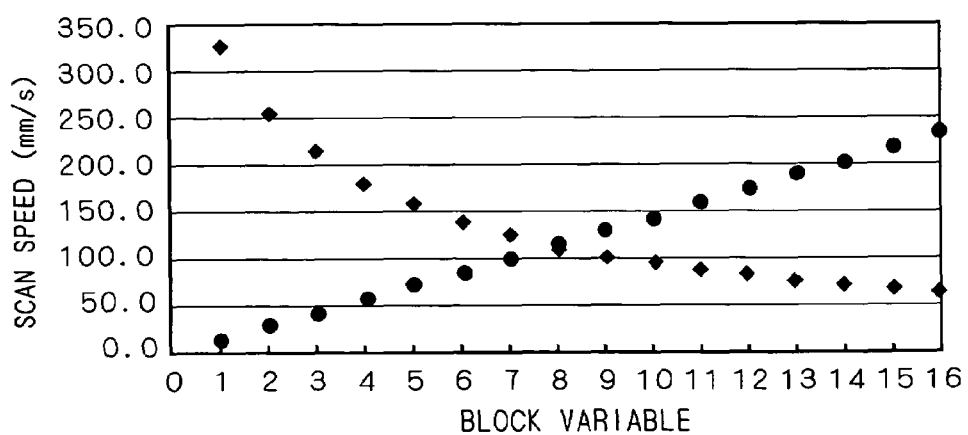
FIG. 15 is a graph illustrating the relationship between a block variable, and a first upper limit value and a second upper limit value.

As shown in FIG. 15, the first upper limit value Va becomes smaller in accordance with increase of the block variable. After the first upper limit value is obtained where required time for modulating the DMD 42 is a limitation, the stage 2 is moved relative to the head 40 by the stage moving mechanism 31 and the head moving mechanism 32, and the light amount sensor 21 is located at an irradiation position of light beams emitted from the head 40. After all the micromirrors of the DMD 42 become in the ON state, an amount of light per unit time which is actually applied on the stage 2 from the light irradiating part 4 is detected by the light amount sensor 21 (Step S22). The amount of light detected by the light amount sensor 21 is the maximum light amount of light applied on the substrate 9 from the lamp house 411 through the DMD 42 in a case where 16 mirror blocks 423 are used.

An amount of light (per unit time) applied per unit area of the substrate 9 is determined by the specifications of the lamp house 411, the illumination optical system 43, and the projection optical system 44. Accordingly, in a predetermined projection ratio of an image of the DMD 42, when the number of mirror blocks 423 used in actual pattern writing decreases, a (total) light amount applied on the substrate 9 becomes smaller than the amount of light detected by the light amount sensor 21. Exactly, since the maximum light amount of light applied on the substrate 9 is proportional to the number of mirror blocks 423 to be used, the maximum light amount in the number K of mirror blocks 423 can be obtained by multiplying K by a value acquired by dividing the maximum amount of light detected by the light amount sensor 21 by number 16 of mirror blocks 423 used in the detection of the amount of light.

Subsequently, in the pattern writing apparatus 1, sensitivity of the photoresist film on the substrate 9, being inputted to the host computer 52 in advance by a user, is inputted to the control unit 51. The sensitivity of the photoresist film means a light amount per unit area required for exposure of the photoresist film (hereinafter, the light amount is referred to as "necessary exposure amount"). If the sensitivity of the photoresist film increases, the necessary exposure amount becomes lower and if the sensitivity of the photoresist film decreases, the necessary exposure amount becomes higher. The necessary exposure amount is obtained in advance as a value which allows the control of the line width and the width of the space at the (controllable) minimum resolution. In the operation part 510, an upper limit value of the scan speed of the irradiation region group, allowing application of the necessary exposure amount on (portions which are to be exposed of) the photoresist film, is obtained as a second upper limit value in accordance with the maximum light amount depending on the number of mirror blocks 423 to be used (Step S23).

Figure 16:
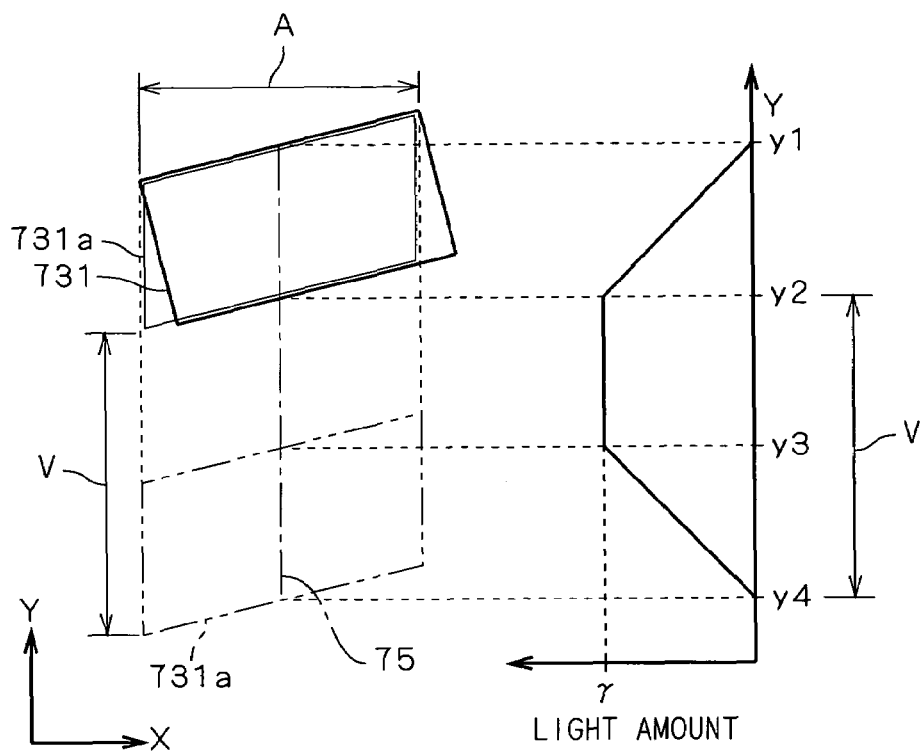
FIG. 16 is a diagram for explaining the relationship between a scan speed and regions on the substrate where writing is performed by scanning of the irradiation region group.

Referring to FIG. 16, discussion will be made on the relationship between the scan speed and regions on the substrate 9 where writing is performed by scanning of the irradiation region group. At the left part of FIG. 16, the outer rim of a certain number of irradiation blocks on the substrate 9 is indicated by a rectangle 731. In the following description, all the micromirrors included in the mirror blocks 423 corresponding to those irradiation blocks are in the ON state and the other micromirrors are in the OFF state.

As described referring to FIG. 12, since the substantial width in the X direction of the irradiation blocks corresponding to the mirror blocks 423 to be used on the substrate 9 is equal to the width (indicated by reference sign A in FIG. 12) in the sub-scanning direction of one side approximately along the sub-scanning direction (X direction) of the rectangular 731, it can be thought that the rectangular 731 representing a predetermined number of irradiation blocks is a parallelogram indicated by reference sign 731a in FIG. 16. The width of the parallelogram 731a in the sub-scanning direction does not depend on the number of mirror blocks 423 to be used. When the scan speed of the irradiation region group is V, the parallelogram 731a moves in a position indicated by dash-double-dot lines in FIG. 16 during unit time and a travel distance is V.

At the left part of FIG. 16, looking at a column of writing cells arranged in the Y direction at a position in the X direction (writing cell column 75 arranged in the Y direction, indicated by a one-dot chain line and the writing cell column is hereinafter, referred to as "target writing cell column"), a light amount (accumulated light amount) applied on the target writing cell column 75 by movement in unit time of the irradiation region group is γ at a portion (between positions y2 and y3) where the whole portion from a lower end to upper end of the parallelogram 731a passes through the target writing cell column 75, as shown in the right part of FIG. 16. At an overlapping portion of the target writing cell column 75 and the parallelogram 731a at the start of movement, the light amount decreases linearly from γ, from the position y2 on the (−Y) side to y1 on the (+Y) side and at an overlapping portion of the target writing cell column 75 and the parallelogram 731a (indicated by dash-double-dot lines) at the end of movement, the light amount decreases linearly from γ, from the position y3 on the (+Y) side to y4 on the (−Y) side.

Actually, the movement of the irradiation region group in the Y direction is continuous, a position of the parallelogram 731a at the start of movement in unit time is an ending position of movement in unit time immediately before the start and a position of the parallelogram 731a at the end of movement in unit time is a starting position of movement in unit time immediately after the end. Accordingly, it can be thought that a length in the Y direction of a region on the substrate 9 where writing is complete by movement of the parallelogram 731a in unit time (i.e., light amount γ is applied to the region) is V. An area of region on the substrate 9 where writing is complete by movement of the irradiation region group in unit time is calculated by the equation (A×V). The area does not depend on the number of mirror blocks 423 to be used.

Thus, to achieve application of the necessary exposure amount on the photoresist film in accordance with the maximum light amount in the parallelogram 731a, the following Eq. 2 needs to be satisfied, where the necessary exposure amount of the photoresist film is E, the maximum light amount of light applied on the substrate 9 in the parallelogram 731a is P, and the area on the substrate 9 where writing is complete by movement of the irradiation region group in unit time is (A×V).

$$E=P/(A \times V) \quad \text{Eq. 2}$$

In the operation part 510, the second upper limit value Vb of scan speed relative to the block variable is calculated from the following Eq. 3 as indicated by a circle in FIG. 15 while the block variable is changed from 1 to 16. In Eq. 3, $P_\alpha$ is a value obtained on the basis of the detection value of the light amount sensor 21 and is the maximum light amount when a certain number of mirror blocks 423 are used, E is the necessary exposure amount of the photoresist film, and A is the substantial width of the irradiation blocks in the sub-scanning direction. In the pattern writing apparatus 1 according to the preferred embodiment, the substantial width of the irradiation blocks in the sub-scanning direction is 8.192 mm, the maximum amount of light detected by the light amount sensor 21 is 960 mW (milliwatt), and the necessary exposure amount E of the photoresist film is 50 mJ/cm².

$$Vb=P_\alpha/(A \times E) \quad \text{Eq.3}$$

As shown in FIG. 15, the second upper limit value Vb becomes greater in accordance with increase of the block variable. Actually, since there are some irradiation regions in OFF state according to the writing cell data, the maximum light amount is not necessarily applied on the substrate 9 by movement in unit time of the irradiation region group. However, with respect to writing cells which are to be exposed, a light amount required for exposure can be at least applied in accordance with an area of the writing cells by moving the irradiation region group at a scan speed equal to or smaller than the second upper limit value Vb obtained from Eq. 3.

After the second upper limit value is obtained where the light amount (necessary exposure amount) applied on the photoresist film is a limitation, a value of the block variable where smaller one of the first upper limit value and the second upper limit value is maximum is obtained and determined as the number of mirror blocks 423 (i.e., operating block number) used for actual pattern writing in the operation part 510 (Step S24). In FIG. 15, the operating block number is determined as 8. Then, smaller one of the first upper limit value and the second upper limit value in the above operating block number in FIG. 15 is outputted to the motor controller 514 as a scan speed and utilized for control of the stage moving mechanism 31, and the operating block number is outputted to the data transfer board 516, to perform pattern writing using the mirror blocks 423 of the operating block number.

When the second upper limit value is greater than the first upper limit value in the operating block number, a scan speed corresponding to the first upper limit value is employed, but in this case, to exactly apply the necessary exposure amount on the photoresist film and achieve control of the line width and the width of the space at the minimum resolution accurately, light intensity applied to the DMD 42 may be reduced by controlling the light control filter 413 so as to satisfy Eq. 2 in the above scan speed. When the first upper limit value is greater than the second upper limit value in the operating block number, after input of the writing signal to the DMD 42, waiting time occurs until the reset pulse is inputted.

In the operation part 510, when the first upper limit value and the second upper limit value are obtained as shown in FIG. 15, the operating block number may be determined as 7 or 9. In other words, in the operation part 510, a value away by 1 from the value of the block variable where smaller one of the first upper limit value and the second upper limit value is exactly maximum can be used as a value of the block variable where smaller one of the first upper limit value and the second upper limit value is maximum, in consideration of other conditions or the like required for writing.

As discussed above, in the operation part 510 of the pattern writing apparatus 1, the first upper limit value of the scan speed is obtained on the basis of the writing pitch and required time function for inputting the writing signal where the number of mirror blocks 423 to be used is a parameter, and the second upper limit value of the scan speed is obtained on the basis of the maximum light amount function of light applied on the substrate 9 where the number of the mirror blocks 423 to be used is a parameter, the substantial width in the sub-scanning direction of the irradiation blocks corresponding to the mirror blocks 423 to be used, and the sensitivity of photosensitive material on the substrate 9. Then, the number of mirror blocks 423 where smaller one of the first upper limit value and the second upper limit value is almost maximum is specified. As a result, the number of mirror blocks 423 used for actual pattern writing can be determined appropriately by computation as the operating block number where the scan speed can be almost maximum, in consideration of required time for input of the writing signal to the DMD 42 and the light amount applied on the photoresist film. In the pattern writing apparatus 1, by performing pattern writing with only the mirror blocks 423 of the operating block number, it is possible to write a pattern on the substrate 9 stably at high speed. Further, in the pattern writing apparatus 1, even if the state of the light source in the lamp house 411 changes, a pattern can be written on the substrate 9 accurately, since the number of mirror blocks 423 used for pattern writing is determined on the basis of amount of light actually detected by the light amount sensor 21.

Figure 17:
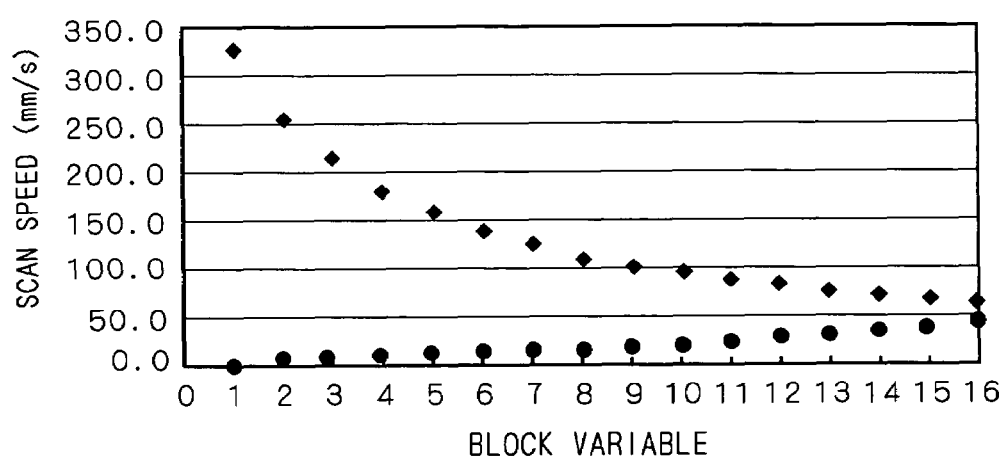
FIGS. 17, 18A and 18B are graphs each illustrating the relationship between a block variable, and a first upper limit value and a second upper limit value.

FIG. 17 is a graph illustrating the first upper limit value and the second upper limit value when the necessary exposure amount of the photoresist film is 300 mJ/cm². In FIG. 17, the first upper limit value is indicated by a rhombus and the second upper limit value is indicated by a circle. Also in this case, the second upper limit value becomes greater in accordance with increase of the block variable, but the second upper limit value is smaller than the first upper limit value at any value of the block variable. Accordingly, number 16 of the mirror blocks 423 where the second upper limit value is maximum is determined as the operating block number in the operation part 510.

Next, discussion will be made on the operating block number determined by the operation part 510, when the reset pulse is inputted to the DMD 42 every time the irradiation region group is scanned by a distance equal to twice the writing pitch, that is, twice (2)-speed writing is performed in the pattern writing apparatus 1 of FIG. 1. The writing pitch is 2 µm and the control pitch is 4 µm. The amount of light detected by the light amount sensor 21 (i.e., the maximum light amount applied on the substrate 9 in the case of 16 mirror blocks) is 900 mW.

Figure 18A:
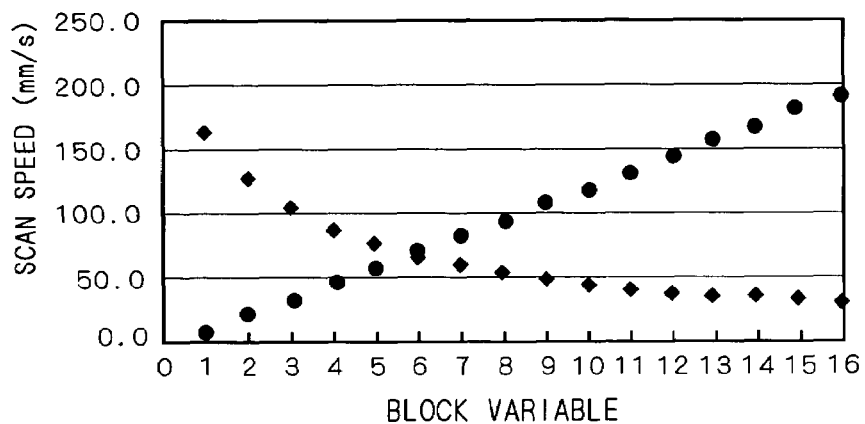

FIG. 18A is a graph illustrating the first upper limit value and the second upper limit value when the necessary exposure amount of the photoresist film is 50 mJ/cm². In FIG. 18A, the first upper limit value is indicated by a rhombus and the second upper limit value is indicated by a circle. Also in this case, in accordance with increase of the block variable, the first upper limit value becomes smaller and the second upper limit value becomes greater. In the operation part 510, number 6 of the mirror blocks 423 where smaller one of the first upper limit value and the second upper limit value is maximum is determined as the operating block number.

Figure 18B:
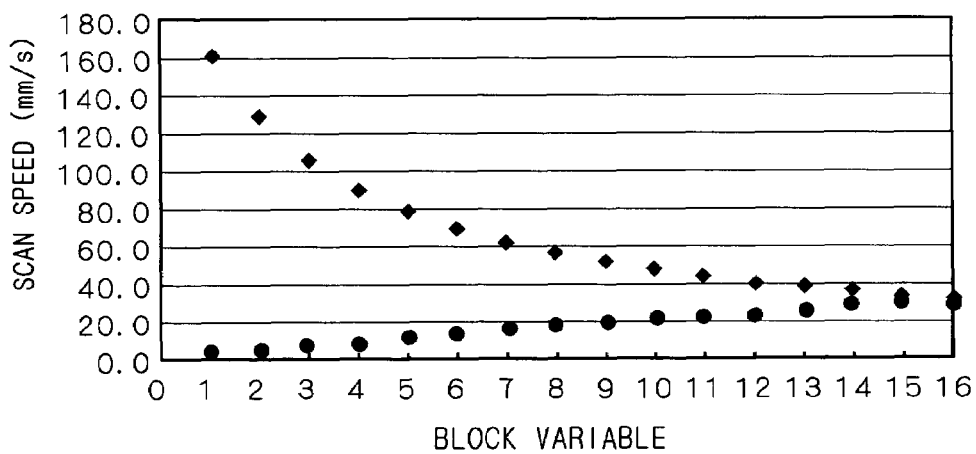

FIG. 18B is a graph illustrating the first upper limit value and the second upper limit value when the necessary exposure amount of the photoresist film is 300 mJ/cm². In FIG. 18B, the first upper limit value is indicated by a rhombus and the second upper limit value is indicated by a circle. Also in this case, tendency of changes relative to the block variable of the first upper limit value and the second upper limit value is the same as that of FIG. 18A, but in FIG. 18B, the second upper limit value is smaller than the first upper limit value at any value of the block variable. Accordingly, number 16 of the mirror blocks 423 where the second upper limit value is maximum is determined as the operating block number in the operation part 510.

Figure 19:
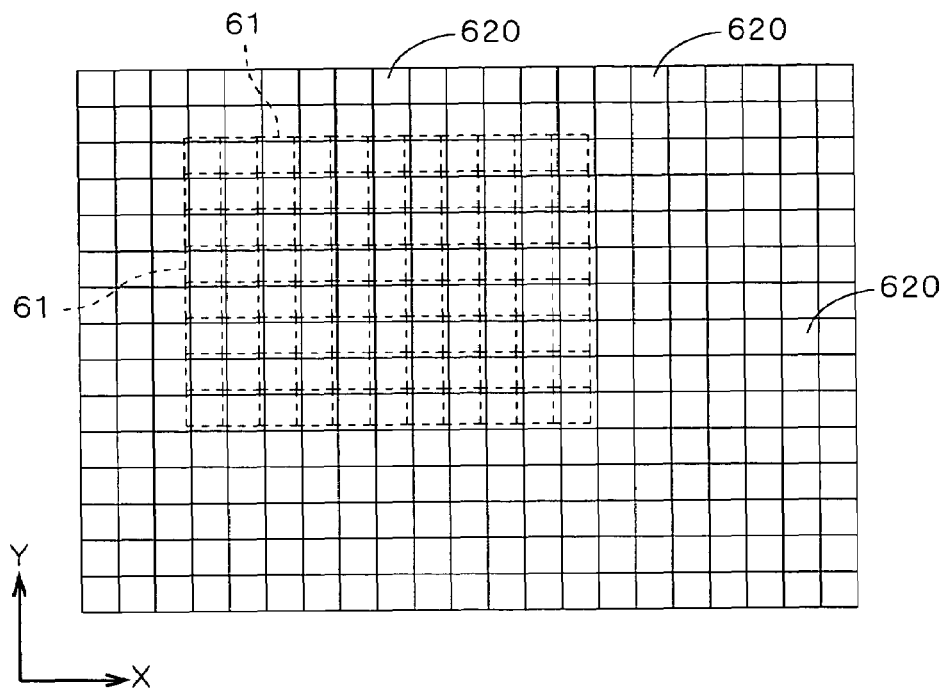
FIG. 19 is a diagram illustrating irradiation regions and writing cells.

Next, discussion will be made on the operating block number determined by the operation part 510, in a case of writing operation where the column direction of the irradiation region group is not tilted relative to the scanning direction in the pattern writing apparatus. FIG. 19 is a diagram illustrating an irradiation region group which is not tilted relative to the scanning direction and a writing cell group on the substrate 9 with overlapping each other in the pattern writing apparatus. In FIG. 19, the lattice irradiation region group is indicated by broken lines and the writing cell group fixedly arranged two-dimensionally on the substrate 9 is indicated by solid lines. Though FIG. 19 shows a state where a position of the irradiation region group is slightly shifted relative to the writing cell group, actually, the size of each irradiation region 61 is the same as that of each writing cell 620 and positions in the X direction of the respective irradiation regions 61 of the irradiation region group are the same as those of the corresponding writing cells. In the pattern writing apparatus in this procedure, the same DMD 42 (which has micromirrors arranged in 768 rows and 1024 columns) as that of the pattern writing apparatus 1 of FIG. 1 is employed.

In a case where the irradiation region group is not titled, multiple exposure is performed on each writing cell 620 with light applied to the irradiation region 61 which is located on the same position as the above writing cell 620 with respect to the X direction. ON/OFF control of light irradiation of each of the irradiation regions 61 is performed every time when the irradiation region group is scanned by a distance equal to one writing pitch. When β rows of micromirrors are used in the DMD 42, exposure is performed β times on each of the writing cells 620. Actually, the writing pitch is 2 μm, the control pitch is also 2 μm and the width of the irradiation region group in the X direction is 2.048 mm. An amount of light detected by the light amount sensor 21 (i.e., the maximum light amount applied on the substrate 9 when 16 mirror blocks) is 160 mW.

Figure 20A:
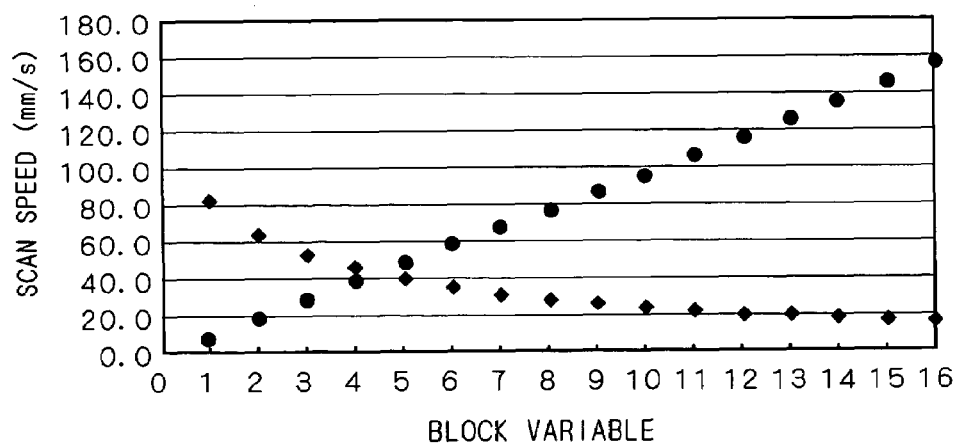
FIGS. 20A and 20B are graphs each illustrating the relationship between a block variable, and a first upper limit value and a second upper limit value.

FIG. 20A is a graph illustrating the first upper limit value and the second upper limit value in a case where the necessary exposure amount of the photoresist film is 50 mJ/cm$^2$. In FIG. 20A, the first upper limit value is indicated by a rhombus and the second upper limit value is indicated by a circle. Also in FIG. 20A, in accordance with increase of the block variable, the first upper limit value becomes smaller and the second upper limit value becomes greater. In the operation part 510, number 5 of the mirror blocks where smaller one of the first upper limit value and the second upper limit value is maximum is determined as the operating block number.

Figure 20B:
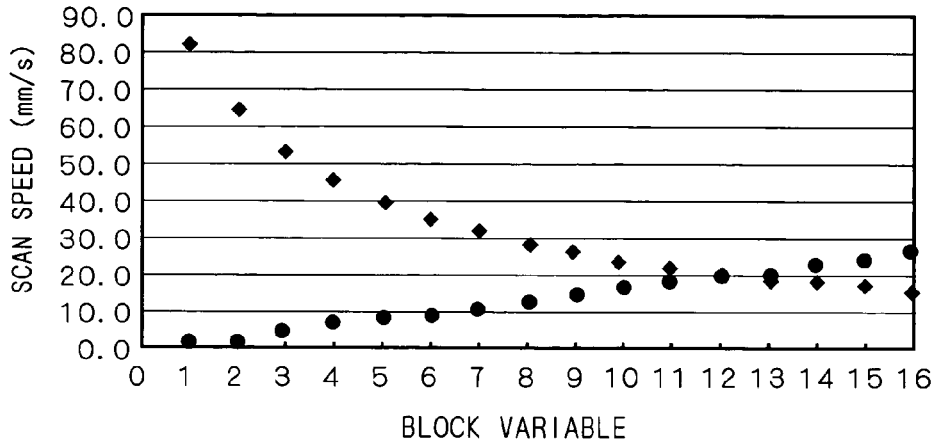

FIG. 20B is a diagram illustrating the first upper limit value and the second upper limit value when the necessary exposure amount of the photoresist film is 300 mJ/cm$^2$. In FIG. 20B, the first upper limit value is indicated by a rhombus and the second upper limit value is indicated by a circle. In the operation part 510, number 12 of the mirror blocks where smaller one of the first upper limit value and the second upper limit value is maximum in FIG. 20B is determined as the operating block number.

As discussed above, in the pattern writing apparatus 1, even if writing is performed without tilting the column direction of the irradiation region group relative to the scanning direction, the number of mirror blocks 423 used for actual pattern writing is determined appropriately by computation, in consideration of required time for input of the writing signal to the DMD 42 and the light amount applied on the photoresist film. As a result, it is possible to write a pattern on the substrate 9 stably at high speed.

In the pattern writing apparatus where the irradiation region group is not titled relative to the scanning direction, if a pattern is written on the substrate 9 at the same writing pitch as that of the pattern writing apparatus 1 of FIG. 1, an image of the DMD 42 on the substrate 9 should be more reductively projected. Actually, the substantial width of the irradiation region group in the sub-scanning direction is 8.192 mm in the pattern writing apparatus 1 of FIG. 1, and conversely in the pattern writing apparatus in this procedure, it is 2.048 mm, although the same writing pitch 2 μm is set as described above. Accordingly, to write a pattern on the substrate 9 at the same pattern resolution, the pattern writing apparatus in this procedure needs more intermittent movement and takes a long time for pattern writing.

In other words, in the same projection ratio, by tilting the irradiation region group relative to the scanning direction, the writing pitch can be set smaller than that in a case where the irradiation region group is not tilted. From the viewpoint of writing a high-definition pattern on the substrate 9 (that is, the pattern resolution of the pattern writing apparatus is improved by making an area of one writing cell smaller), it is preferable that the column direction of the irradiation region group is titled relative to the scanning direction so that a distance with respect to the sub-scanning direction between the center of one irradiation region and the center of another irradiation region belonging to the column including the one irradiation region is equal to a pitch of the writing cells in the sub-scanning direction in the irradiation region group. On the other hand, in the pattern writing apparatus where the irradiation region group is not tilted relative to the scanning direction, it is possible to write a pattern on the substrate 9 by easy control.

Regardless of the presence or absence of the tilting of the irradiation region group, it is thought that the scan speed corresponding to the operating block number determined by the operation part 510 is greater than the maximum scan speed of the irradiation region group in the stage moving mechanism 31 in the pattern writing apparatus. In such a case, a maximum light amount $P_c$ which is to be obtained when all the micromirrors included in the operating blocks are the ON state is calculated from Eq. 4 in the operation part 510, where $V_{max}$ is the maximum scan speed in the stage moving mechanism 31, A is the substantial width of the irradiation blocks in the sub-scanning direction, and E is the necessary exposure amount of the photoresist film on the substrate 9.

$$P_c = V_{max} \times (A \times E) \qquad \text{Eq.4}$$

In accordance with an obtained maximum light amount $P_c$, the light control filter 413 is controlled and light intensity applied to the DMD 42 is reduced. This makes it possible to write a pattern on the substrate 9 at an appropriate light amount while the irradiation region group is scanned on the substrate 9 at the maximum scan speed, even if a scan speed determined by the operation part 510 together with the operating block number is greater than the maximum scan speed in the stage moving mechanism 31.

Figure 21:
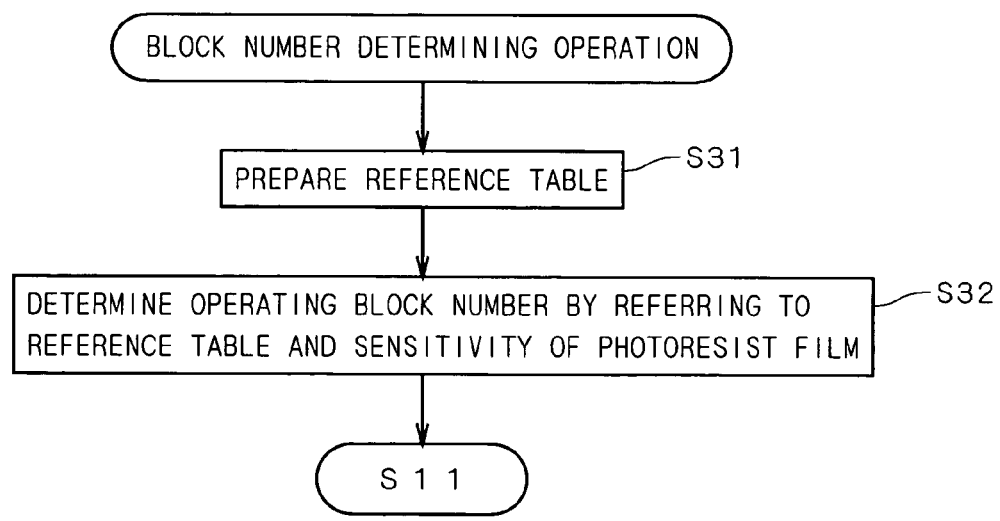
FIG. 21 is a flowchart illustrating an operation flow for determining operating block number.

Next, discussion will be made on a second preferred embodiment of the present invention. FIG. 21 is a flowchart illustrating an operation flow for determining an operating block number in a pattern writing apparatus in accordance with the second preferred embodiment and shows an operation in Step S10 of FIG. 6. In the second preferred embodiment, first, a reference table which is generated by obtaining the number of mirror blocks, where a scan speed can be maximized, with changing the necessary exposure amount of the photoresist film is prepared in advance (Step S31). In the following description, an operation for generating a reference table which is prepared for twice (2)-speed writing in the pattern writing apparatus will be described. The constituent elements of the pattern writing apparatus are the same as those of FIG. 1.

For example, when the necessary exposure amount E is each of 10, 30, 50, 70, 100, 150, 200, 250, 300, and 400 (mJ/cm$^2$), a second upper limit value Vb relative to the block variable is calculated from the above Eq. 3 as shown in Table 1. In Eq. 3, $P_\alpha$ is the maximum light amount depending on the number of mirror blocks, and A is the substantial width of irradiation blocks in the sub-scanning direction. At this time, the maximum light amount $P_\alpha$ is obtained by multiplying a predetermined value (50 mW) by the number of mirror blocks, and the substantial width of irradiation blocks in the sub-scanning direction is 8.192 mm.

TABLE 1

| BLOCK VARIABLE | MAXIMUM LIGHT AMOUNT (mW) | SECOND UPPER LIMIT VALUE (mm/s) | | | | | | | | | |
|---|---|---|---|---|---|---|---|---|---|---|---|
| | | 10 | 30 | 50 | 70 | 100 | 150 | 200 | 250 | 300 | 400 |
| 1 | 50 | 61.0 | 20.3 | 12.2 | 8.7 | 6.1 | 4.1 | 3.1 | 2.4 | 2.0 | 1.5 |
| 2 | 100 | 122.1 | 40.7 | 24.4 | 17.4 | 12.2 | 8.1 | 6.1 | 4.9 | 4.1 | 3.1 |
| 3 | 150 | 183.1 | 61.0 | 36.6 | 26.2 | 18.3 | 12.2 | 9.2 | 7.3 | 6.1 | 4.6 |
| 4 | 200 | 244.1 | 81.4 | 48.8 | 34.9 | 24.4 | 16.3 | 12.2 | 9.8 | 8.1 | 6.1 |
| 5 | 250 | 305.2 | 101.7 | 61.0 | 43.6 | 30.5 | 20.3 | 15.3 | 12.2 | 10.2 | 7.6 |
| 6 | 300 | 366.2 | 122.1 | 73.2 | 52.3 | 36.6 | 24.4 | 18.3 | 14.6 | 12.2 | 9.2 |
| 7 | 350 | 427.2 | 142.4 | 85.4 | 61.0 | 42.7 | 28.5 | 21.4 | 17.1 | 14.2 | 10.7 |
| 8 | 400 | 488.3 | 162.8 | 97.7 | 69.8 | 48.8 | 32.6 | 24.4 | 19.5 | 16.3 | 12.2 |
| 9 | 450 | 549.3 | 183.1 | 109.9 | 78.5 | 54.9 | 36.6 | 27.5 | 22.0 | 18.3 | 13.7 |
| 10 | 500 | 610.4 | 203.5 | 122.1 | 87.2 | 61.0 | 40.7 | 30.5 | 24.4 | 20.3 | 15.3 |
| 11 | 550 | 671.4 | 223.8 | 134.3 | 95.9 | 67.1 | 44.8 | 33.6 | 26.9 | 22.4 | 16.8 |
| 12 | 600 | 732.4 | 244.1 | 146.5 | 104.6 | 73.2 | 48.8 | 36.6 | 29.3 | 24.4 | 18.3 |
| 13 | 650 | 793.5 | 264.5 | 158.7 | 113.4 | 79.3 | 52.9 | 39.7 | 31.7 | 26.4 | 19.8 |
| 14 | 700 | 854.5 | 284.8 | 170.9 | 122.1 | 85.4 | 57.0 | 42.7 | 34.2 | 28.5 | 21.4 |
| 15 | 750 | 915.5 | 305.2 | 183.1 | 130.8 | 91.6 | 61.0 | 45.8 | 36.6 | 30.5 | 22.9 |
| 16 | 800 | 976.6 | 325.5 | 195.3 | 139.5 | 97.7 | 65.1 | 48.8 | 39.1 | 32.6 | 24.4 |

In Table 1, "10", "30", "50", "70", "100", "200", "250", "300", and "400" under the expression of "second upper limit value" are values of the necessary exposure amount, respectively, and second upper limit values relative to the block variable in each necessary exposure amount are shown under each of the values. A unit of the necessary exposure amount is (mJ/cm$^2$). In Table 1, values of the maximum light amount corresponding to the block variable are also shown.

A first upper limit value Va of a scan speed relative to the block variable is calculated from the above Eq. 1 as shown in Table 2 while the block variable is changed from 1 to 16, where $t_\alpha$ is the minimum reset period in a certain number of mirror blocks and r is a control pitch which is set in advance to the pattern writing apparatus. In Table 2, values of the minimum reset period relative to the block variable are also shown. In the pattern writing apparatus in accordance with the preferred embodiment, since twice (2)-speed writing is performed on the writing cell group arranged two-dimensionally at a writing pitch of 2 μm, the control pitch is 4 μm.

TABLE 2

| BLOCK VARIABLE | MINIMUM RESET PERIOD (μ SECOND) | FIRST UPPER LIMIT VALUE (mm/s) |
|---|---|---|
| 1 | 24.5 | 163.3 |
| 2 | 31 | 129.0 |
| 3 | 37.5 | 106.7 |

TABLE 2-continued

| BLOCK VARIABLE | MINIMUM RESET PERIOD (μ SECOND) | FIRST UPPER LIMIT VALUE (mm/s) |
|---|---|---|
| 4 | 44 | 90.9 |
| 5 | 50.5 | 79.2 |
| 6 | 57 | 70.2 |
| 7 | 63.5 | 63.0 |
| 8 | 70 | 57.1 |
| 9 | 76.5 | 52.3 |
| 10 | 83 | 48.2 |
| 11 | 89.5 | 44.7 |
| 12 | 96 | 41.7 |
| 13 | 102.5 | 39.0 |
| 14 | 109 | 36.7 |
| 15 | 115.5 | 34.6 |
| 16 | 122 | 32.8 |

Next, each second upper limit value in Table 1 which is specified by the value of the block variable and the necessary exposure amount is compared with a first upper limit value corresponding to the same block variable in Table 2. When the second upper limit value is larger than the first upper limit value, the second upper limit value in Table 1 is changed to the first upper limit value to be compared, and Table 3 is generated. Hereinafter, smaller one of the first upper limit value and the second upper limit value is referred to as simply "upper limit value of scan speed".

TABLE 3

| BLOCK VARIABLE | UPPER LIMIT VALUE OF SCAN SPEED (mm/s) | | | | | | | | | |
|---|---|---|---|---|---|---|---|---|---|---|
| | 10 | 30 | 50 | 70 | 100 | 150 | 200 | 250 | 300 | 400 |
| 1 | 61.0 | 20.3 | 12.2 | 8.7 | 6.1 | 4.1 | 3.1 | 2.4 | 2.0 | 1.5 |
| 2 | 122.1 | 40.7 | 24.4 | 17.4 | 12.2 | 8.1 | 6.1 | 4.9 | 4.1 | 3.1 |
| 3 | 106.7 | 61.0 | 36.6 | 26.2 | 18.3 | 12.2 | 9.2 | 7.3 | 6.1 | 4.6 |
| 4 | 90.9 | 81.4 | 48.8 | 34.9 | 24.4 | 16.3 | 12.2 | 9.8 | 8.1 | 6.1 |
| 5 | 79.2 | 79.2 | 61.0 | 43.6 | 30.5 | 20.3 | 15.3 | 12.2 | 10.2 | 7.6 |
| 6 | 70.2 | 70.2 | 70.2 | 52.3 | 36.6 | 24.4 | 18.3 | 14.6 | 12.2 | 9.2 |
| 7 | 63.0 | 63.0 | 63.0 | 61.0 | 42.7 | 28.5 | 21.4 | 17.1 | 14.2 | 10.7 |
| 8 | 57.1 | 57.1 | 57.1 | 57.1 | 48.8 | 32.6 | 24.4 | 19.5 | 16.3 | 12.2 |
| 9 | 52.3 | 52.3 | 52.3 | 52.3 | 52.3 | 36.6 | 27.5 | 22.0 | 18.3 | 13.7 |
| 10 | 48.2 | 48.2 | 48.2 | 48.2 | 48.2 | 40.7 | 30.5 | 24.4 | 20.3 | 15.3 |

TABLE 3-continued

| BLOCK | UPPER LIMIT VALUE OF SCAN SPEED (mm/s) | | | | | | | | | |
|---|---|---|---|---|---|---|---|---|---|---|
| VARIABLE | 10 | 30 | 50 | 70 | 100 | 150 | 200 | 250 | 300 | 400 |
| 11 | 44.7 | 44.7 | 44.7 | 44.7 | 44.7 | 44.7 | 33.6 | 26.9 | 22.4 | 16.8 |
| 12 | 41.7 | 41.7 | 41.7 | 41.7 | 41.7 | 41.7 | 36.6 | 29.3 | 24.4 | 18.3 |
| 13 | 39.0 | 39.0 | 39.0 | 39.0 | 39.0 | 39.0 | 39.0 | 31.7 | 26.4 | 19.8 |
| 14 | 36.7 | 36.7 | 36.7 | 36.7 | 36.7 | 36.7 | 36.7 | 34.2 | 28.5 | 21.4 |
| 15 | 34.6 | 34.6 | 34.6 | 34.6 | 34.6 | 34.6 | 34.6 | 34.6 | 30.5 | 22.9 |
| 16 | 32.8 | 32.8 | 32.8 | 32.8 | 32.8 | 32.8 | 32.8 | 32.8 | 32.6 | 24.4 |

In Table 3, "10", "30", "50", "70", "100", "150", "200", "250", "300", and "400" under the expression of "upper limit value of scan speed" are values of the necessary exposure amount, respectively, and upper limit values of scan speed relative to the block variable in each necessary exposure amount are shown under each of the values. A unit of the necessary exposure amount is (mJ/cm$^2$).

In table 3, with respect to each necessary exposure amount, a value of the block variable where the upper limit value of scan speed is maximum is specified, therefore, a reference table which represents the number of mirror blocks where the scan speed can be maximized and the upper limit value of the scan speed corresponding to the number of the mirror blocks in each necessary exposure amount of the photoresist film is generated as shown in Table 4.

TABLE 4

| | NECESSARY EXPOSURE AMOUNT | | | | | | | | | |
|---|---|---|---|---|---|---|---|---|---|---|
| | 10 | 30 | 50 | 70 | 100 | 150 | 200 | 250 | 300 | 400 |
| NUMBER OF MIRROR BLOCKS | 2 | 4 | 6 | 7 | 9 | 11 | 13 | 15 | 16 | 16 |
| UPPER LIMIT VALUE OF SCAN SPEED | 122.1 | 81.4 | 70.2 | 61.0 | 52.3 | 44.7 | 39.0 | 34.6 | 32.6 | 24.4 |

In table 4, a unit of the necessary exposure amount is (mJ/cm$^2$), and a unit of the scan speed is (mm/s). In consideration of other conditions or the like required for writing, with respect to each necessary exposure amount, a number away by 1 from the number of mirror blocks where the upper limit value of the scan speed is exactly maximum is specified, and a reference table representing the relationship between the number of mirror blocks where the scan speed can be maximized and sensitivity of the photoresist film may be generated.

Figure 22:
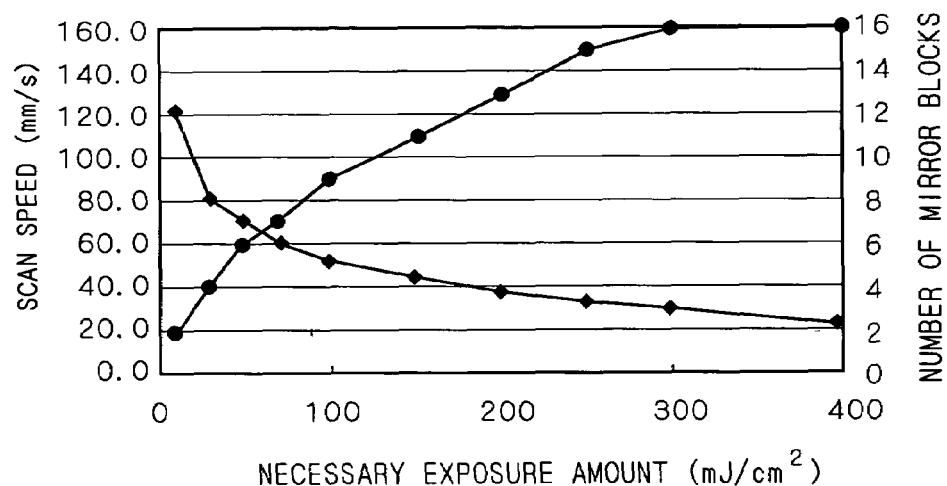
FIGS. 22 to 24 are diagrams each illustrating a reference table in graph.

FIG. 22 is a diagram illustrating a generated reference table in graph. The left vertical axis, the right vertical axis, and the horizontal axis represent a scan speed, the number of mirror blocks, and the necessary exposure amount of photoresist film, respectively. In FIG. 22, the number of mirror blocks is indicated by a circle and the upper limit value of the scan speed is indicated by a rhombus. Thus, in the pattern writing apparatus, a reference table representing the relationship between the number of mirror blocks where the scan speed can be maximized and sensitivity of the photoresist film is prepared in advance and stored in the memory 512 of the operation part 510 in FIG. 2.

In the control unit 51, sensitivity of the photoresist film (necessary exposure amount) on the substrate 9 to be written is inputted from the host computer 52, and the number of mirror blocks used for actual pattern writing (i.e., operating block number) is determined by referring to the reference table from the sensitivity in the CPU 511 (Step S32).

In the pattern writing apparatus, the light control filter 413 is controlled so that the maximum amount of light, detected by the light amount sensor 21 in a case where all the micromirrors of the DMD 42 are the ON state, becomes a predetermined value (800 mW). Then, pattern writing is performed by using mirror block(s) of the operating block number (FIG. 6: Steps S11 to S18).

As discussed above, in the operation part 510 in accordance with the preferred embodiment, the reference table representing the relationship between the number of mirror blocks where the scan speed can be almost maximized and the sensitivity of the photoresist film is stored in the memory 512 in advance. Then, the CPU 511 functions as a block number determining part and determines the operating block number by referring to the reference table and the sensitivity of the photoresist film on the substrate 9 to be written. This makes it possible to easily determine the number of mirror blocks used for actual pattern writing and consequently write a pattern on the substrate 9 stably at high speed in the pattern writing apparatus. If a reference table represents the relationship between the number of mirror blocks where the scan speed can be maximized and the sensitivity of the photoresist film, the reference table can be prepared as a graph illustrated in FIG. 22, for example, and stored in the memory 512.

Figure 23:
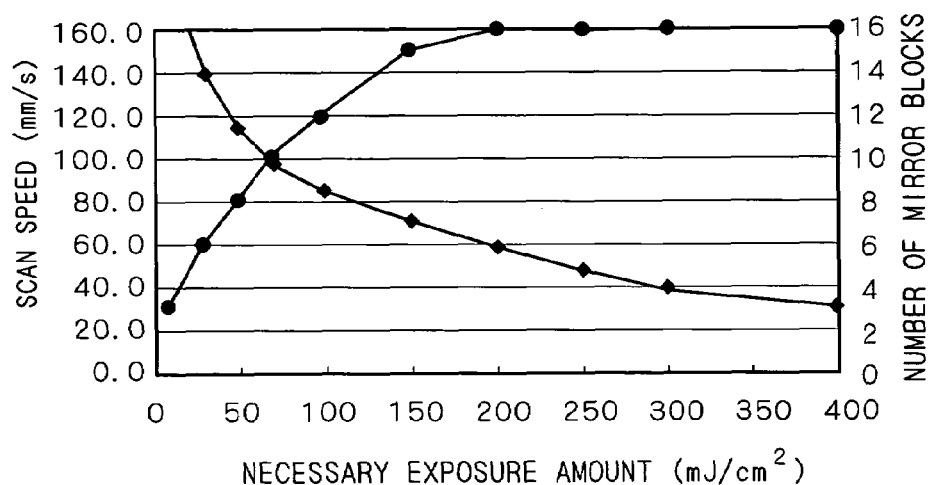

FIG. 23 is a diagram illustrating a reference table in graph, prepared in a case where quad (4)-speed writing is performed in the pattern writing apparatus. The left vertical axis, the right vertical axis, and the horizontal axis represent a scan speed, the number of mirror blocks, and the necessary exposure amount of photoresist film, respectively. In FIG. 23, the number of mirror blocks is indicated by a circle and the upper limit value of the scan speed is indicated by a rhombus. The maximum amount of light where all the micromirrors of the DMD 42 are the ON state is set as 960 mW in advance and the control pitch in pattern writing is 8 μm. In the pattern writing apparatus, since a reference table in a different control pitch is also prepared in advance and stored in the memory 512, after a reference table which is to be referred by the CPU 511 is selected on the basis of a value of the control pitch inputted by a user, it is possible to determine the operating block number on the basis of the necessary exposure amount of the photoresist film on the substrate 9 to be written.

Figure 24:
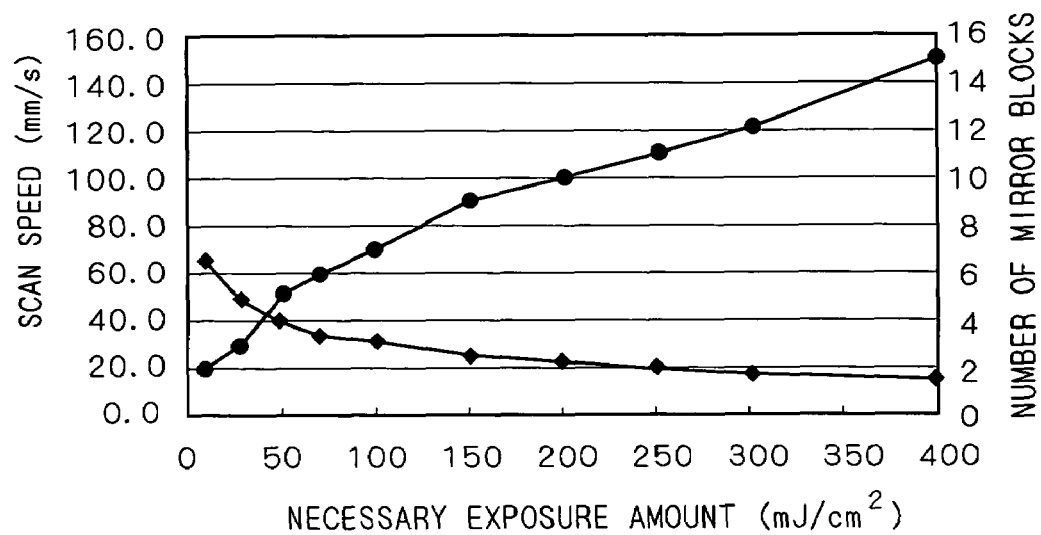

FIG. 24 is a diagram illustrating a reference table in graph, prepared in a case where writing is performed in the pattern writing apparatus (which is described referring to FIG. 19) where the irradiation region group is not tilted relative to the scanning direction, and the left vertical axis, the right vertical axis, and the horizontal axis represent a scan speed, the number of mirror blocks, and the necessary exposure amount of photoresist film, respectively. In FIG. 24, the number of mirror blocks is indicated by a circle and the upper limit value of the scan speed is indicated by a rhombus. The writing pitch and the control pitch are 2 μm and in this case, the width of the irradiation region group in the X direction is 2.048 mm. The maximum amount of light where all the micromirrors of the DMD 42 are the ON state is set as 160 mW in advance. Thus, also in the pattern writing apparatus where the irradiation region group is not tilted relative to the scanning direction, it is possible to easily determine the operating block number on the basis of the sensitivity of the photoresist film to be written while preparing the reference table in advance.

In the pattern writing apparatus where the operating block number is determined on the basis of the reference table, if the scan speed corresponding to the determined operating block number is greater than the maximum scan speed in the stage moving mechanism 31, the light intensity applied to the DMD 42 is reduced by the light control filter 413, the irradiation region group on the substrate 9 moves at the maximum scan speed in the stage moving mechanism 31, and pattern writing may be performed.

Though the preferred embodiments of the present invention have been discussed above, the present invention is not limited to the above-discussed preferred embodiments, but allows various variations.

The spatial light modulator provided in the pattern writing apparatus is not limited to the DMD 42 employed in the first and second preferred embodiments, but may be one such as a liquid crystal shutter which directs light from the lamp house 411 with spatially modulating and has a plurality of shutter elements arranged in the row and column directions, where input of writing signal indicating ON/OFF control of light irradiation of irradiation region corresponding to each shutter element is sequentially received row by row, and ON/OFF control of light irradiation of irradiation regions corresponding to at least one row to which the writing signal is inputted is simultaneously carried out. In other word, the spatial light modulator provided in the pattern writing apparatus may be one which spatially modulates light emitted from the lamp house 411 and directs modulated light beams to a plurality of irradiation regions, respectively, which are arranged in row and column directions being perpendicular to each other on the substrate 9, the plurality of irradiation regions forming a plurality of irradiation blocks arranged in the column direction, in each of which irradiation regions are arranged in at least one row, writing signal being sequentially inputted to at least one modulation block on the spatial light modulator (the mirror block 423 on the DMD 42) out of a plurality of modulation blocks which correspond to the plurality of irradiation blocks, respectively, ON/OFF control of light irradiation of irradiation regions included in at least one irradiation block corresponding to at least one modulation block being simultaneously carried out.

The relationship between the irradiation region group and the writing cells is not limited to those described in the above preferred embodiments, and they may be changed as appropriate according to apparatus specifications. In this case, the tilt angle of the irradiation region group relative to the main scanning direction is allowed to change as appropriate according to the sizes of the irradiation region and the writing cell and according to the number of repetitive exposures, only if in the scanning of the irradiation region group, at least any one irradiation region included in each irradiation block relatively passes over each of writing cells of the writing cell group which is fixedly arranged two-dimensionally on the substrate 9 to allow repetitive exposures (or multiple irradiations).

The relative movement of the stage 2 and the head 40 in the main scanning direction and the sub-scanning direction (i.e., relative movement of the writing cell group and the irradiation region group on the substrate 9) may be substituted by movement of only either one of the stage 2 and head 4.

When the scan speed determined by the operation part 510 is greater than the maximum scan speed in the stage moving mechanism 31, a light intensity control part for reducing light intensity applied to the DMD 42 may be something other than the light control filter 413. For example, when using a light emitting diode as the light source in the lamp house 411, light intensity applied to the DMD 42 can be reduced by decreasing power supplied to the light emitting diode.

An object to be written in the pattern writing apparatus may be a photosensitive material other than the photoresist film formed on the substrate 9.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2005-158382 filed in the Japan Patent Office on May 31, 2005, the entire disclosure of which is incorporated herein by reference.

What is claimed is:

1. A pattern writing apparatus for writing a pattern by applying light on a photosensitive material, comprising:
  a light source part;
  a spatial light modulator for spatially modulating light emitted from said light source part and directing modulated light beams to a plurality of irradiation regions, respectively, which are arranged in a row direction and a column direction being perpendicular to each other on a photosensitive material, said plurality of irradiation regions forming a plurality of irradiation blocks arranged in said column direction, in each of which irradiation regions are arranged in at least one row, writing signal being sequentially inputted to at least one modulation block on said spatial light modulator out of a plurality of modulation blocks which correspond to said plurality of irradiation blocks, respectively, ON/OFF control of light irradiation of irradiation regions included in at least one irradiation block corresponding to said at least one modulation block being simultaneously carried out;
  a scanning mechanism for scanning said plurality of irradiation blocks over a photosensitive material in a predetermined scanning direction, writing regions being fixedly arranged two-dimensionally on said photosensitive material at a predetermined writing pitch in said scanning direction, over each of said writing regions relatively passing at least any one irradiation region included in each irradiation block;

a writing controller for inputting said writing signal to said spatial light modulator in synchronization with scanning of said plurality of irradiation blocks; and a block number determining part for determining the number of modulation blocks used for pattern writing as operating block number where a scan speed can be maximized.

2. The pattern writing apparatus according to claim 1, wherein said block number determining part obtains a first upper limit value of a scan speed on the basis of said writing pitch and required time function for inputting said writing signal where the number of modulation blocks to be used is a parameter, and a second upper limit value of a scan speed on the basis of the maximum light amount function of light applied on a photosensitive material where the number of said modulation blocks to be used is a parameter, a substantial width in a direction perpendicular to said scanning direction of irradiation blocks corresponding to said modulation blocks to be used, and sensitivity of said photosensitive material, and said block number determining part determines the number of said modulation blocks to be used where smaller one of said first upper limit value and said second upper limit value is maximum as said operating block number.

3. The pattern writing apparatus according to claim 2, further comprising:

a light amount sensor for detecting an amount of light applied on a photosensitive material from said light source part through said spatial light modulator, wherein said block number determining part obtains said maximum light amount on the basis of said amount of light.

4. The pattern writing apparatus according to claim 1, further comprising:

a memory for storing a reference table representing a relationship between the number of modulation blocks where a scan speed can be maximized and sensitivity of a photosensitive material, wherein said block number determining part determines said operating block number by referring to said reference table and sensitivity of a photosensitive material to be written.

5. The pattern writing apparatus according to claim 1, wherein said spatial light modulator comprises two-dimensional array of a plurality of micromirrors, positions of which are individually changed.

6. The pattern writing apparatus according to claim 1, wherein said scanning direction is titled relative to said column direction, and a distance with respect to a direction perpendicular to said scanning direction between a center of one irradiation region and a center of another irradiation region belonging to a column including said one irradiation region is equal to a pitch of said writing regions in said direction perpendicular to said scanning direction.

7. The pattern writing apparatus according to claim 1, further comprising:

a light intensity control part for reducing light intensity applied to said spatial light modulator in a case where a scan speed corresponding to said operating block number determined by said block number determining part is greater than the maximum scan speed in said scanning mechanism.

8. A block number determining method for determining operating block number of modulation blocks used for actual pattern writing in a pattern writing apparatus for writing a pattern on a photosensitive material, said pattern writing apparatus comprising a spatial light modulator for spatially modulating light emitted from a light source part and directing modulated light beams to a plurality of irradiation regions, respectively, which are arranged in a row direction and a column direction being perpendicular to each other on a photosensitive material, said plurality of irradiation regions forming a plurality of irradiation blocks arranged in said column direction, in each of which irradiation regions are arranged in at least one row, writing signal being sequentially inputted to at least one modulation block on said spatial light modulator out of a plurality of modulation blocks which correspond to said plurality of irradiation blocks, respectively, ON/OFF control of light irradiation of irradiation regions included in at least one irradiation block corresponding to said at least one modulation block being simultaneously carried out, and a scanning mechanism for scanning said plurality of irradiation blocks over a photosensitive material in a predetermined scanning direction, writing regions being fixedly arranged two-dimensionally on said photosensitive material at a predetermined writing pitch in said scanning direction, over each of said writing regions relatively passing at least any one irradiation region included in each irradiation block, wherein said writing signal is inputted to said spatial light modulator in synchronization with scanning of said plurality of irradiation blocks, said block number determining method comprising the steps of:

a) obtaining a first upper limit value of a scan speed on the basis of said writing pitch and required time function for inputting said writing signal where the number of modulation blocks to be used is a parameter, b) obtaining a second upper limit value of a scan speed on the basis of the maximum light amount function of light applied on a photosensitive material where the number of said modulation blocks to be used is a parameter, a substantial width in a direction perpendicular to said scanning direction of irradiation blocks corresponding to said modulation blocks to be used, and sensitivity of said photosensitive material, and c) determining the number of said modulation blocks to be used where smaller one of said first upper limit value and said second upper limit value is maximum as operating block number of modulation blocks used for actual pattern writing.

9. The block number determining method according to claim 8, further comprising the step of:

detecting an amount of light applied on said photosensitive material from said light source part through said spatial light modulator before said step b), wherein in said step b), said maximum light amount is obtained on the basis of said amount of light.

10. The block number determining method according to claim 8, wherein said spatial light modulator comprises two-dimensional array of a plurality of micromirrors, positions of which are individually changed.

11. The block number determining method according to claim 8, wherein
said scanning direction is titled relative to said column direction, and
a distance with respect to a direction perpendicular to said scanning direction between a center of one irradiation region and a center of another irradiation region belonging to a column including said one irradiation region is equal to a pitch of said writing regions in said direction perpendicular to said scanning direction.

12. A block number determining method for determining operating block number of modulation blocks used for actual pattern writing in a pattern writing apparatus for writing a pattern on a photosensitive material, said pattern writing apparatus comprising a spatial light modulator for spatially modulating light emitted from a light source part and directing modulated light beams to a plurality of irradiation regions, respectively, which are arranged in a row direction and a column direction being perpendicular to each other on a photosensitive material, said plurality of irradiation regions forming a plurality of irradiation blocks arranged in said column direction, in each of which irradiation regions are arranged in at least one row, writing signal being sequentially inputted to at least one modulation block on said spatial light modulator out of a plurality of modulation blocks which correspond to said plurality of irradiation blocks, respectively, ON/OFF control of light irradiation of irradiation regions included in at least one irradiation block corresponding to said at least one modulation block being simultaneously carried out, and a scanning mechanism for scanning said plurality of irradiation blocks over a photosensitive material in a predetermined scanning direction, writing regions being fixedly arranged two-dimensionally on said photosensitive material at a predetermined writing pitch in said scanning direction, over each of said writing regions relatively passing at least any one irradiation region included in each irradiation block, wherein said writing signal is inputted to said spatial light modulator in synchronization with scanning of said plurality of irradiation blocks,
said block number determining method comprising the steps of:
preparing a reference table representing a relationship between the number of modulation blocks where a scan speed can be maximized and sensitivity of a photosensitive material, and
determining operating block number by referring to said reference table and sensitivity of a photosensitive material to be written.

13. The block number determining method according to claim 12, wherein
said spatial light modulator comprises two-dimensional array of a plurality of micromirrors, positions of which are individually changed.

14. The block number determining method according to claim 12, wherein
said scanning direction is titled relative to said column direction, and
a distance with respect to a direction perpendicular to said scanning direction between a center of one irradiation region and a center of another irradiation region belonging to a column including said one irradiation region is equal to a pitch of said writing regions in said direction perpendicular to said scanning direction.

* * * * *